(12) United States Patent
Gregor et al.

(10) Patent No.: US 6,304,122 B1
(45) Date of Patent: Oct. 16, 2001

(54) LOW POWER LSSD FLIP FLOPS AND A FLUSHABLE SINGLE CLOCK SPLITTER FOR FLIP FLOPS

(75) Inventors: Roger P. Gregor, Endicott, NY (US); Steven F. Oakland, Colchester, VT (US); Toshiharu Saitoh; Sebastian T. Ventrone, both of South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/641,425

(22) Filed: Aug. 17, 2000

(51) Int. Cl.[7] ................................................. H03K 3/289
(52) U.S. Cl. ............................................................ 327/202
(58) Field of Search ................................... 327/202–204, 327/404, 403, 212

(56) References Cited

U.S. PATENT DOCUMENTS

| | | | |
|---|---|---|---|
| 4,771,285 | 9/1988 | Agrawal et al. | 307/465 |
| 4,961,013 | 10/1990 | Obermeyer, Jr. et al. | 307/480 |
| 5,015,875 | * 5/1991 | Giles et al. | 327/203 |
| 5,036,217 | 7/1991 | Rollins et al. | 307/272.2 |
| 5,252,917 | * 10/1993 | Kadowski | 326/97 |
| 5,463,338 | * 10/1995 | Yurash | 327/202 |
| 5,651,013 | 7/1997 | Iadanza | 371/22.3 |
| 5,719,878 | * 2/1998 | Yu et al. | 327/202 |
| 5,760,627 | 6/1998 | Gregor et al. | 327/215 |
| 5,920,575 | 7/1999 | Gregor et al. | 371/22.31 |

* cited by examiner

*Primary Examiner*—Toan Tran
(74) *Attorney, Agent, or Firm*—Schmeiser, Olsen & Watts; Ronald A. Kaschak

(57) ABSTRACT

This invention reduces power in flip flop apparatuses by providing flip flop apparatuses that have fewer clock trees than prior art flip flops yet still support some or all of the Level Sensitive Scan Design (LSSD) functionality. In preferred embodiments of the present invention, one clock tree is used instead of two to provide lower power, and less switching devices in clocks splitters are used, which also provides lower power. Additionally, a flushable single clock splitter is provided that allows one clock tree to be used up to the flushable single clock splitter and provides two clocks on the output of the flushable single clock splitter. This saves some power yet still allows for dual clock flip flop designs.

22 Claims, 19 Drawing Sheets

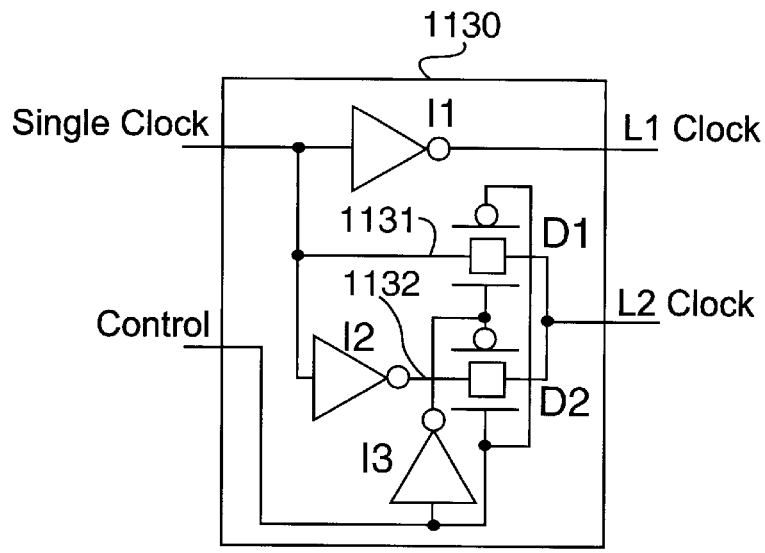
FIG. 12
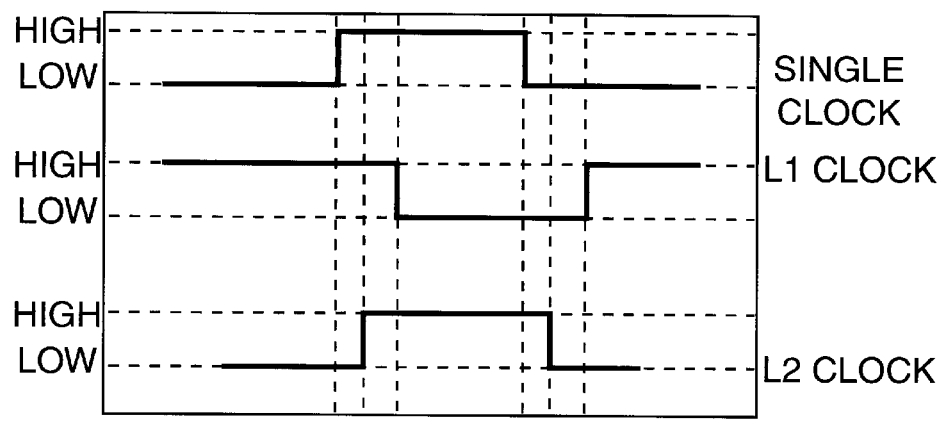
FIG. 13
| Single | Control | L1 Clock | L2 Clock |
|--------|---------|----------|----------|
| 1 | 0 | 0 | 1 |
| 0 | 0 | 1 | 0 |
| 1 | 1 | 0 | 0 |
| 0 | 1 | 1 | 1 |
FIG. 14

LOW POWER LSSD FLIP FLOPS AND A FLUSHABLE SINGLE CLOCK SPLITTER FOR FLIP FLOPS

BACKGROUND OF THE INVENTION

1. Technical Field

This invention generally relates to Level Sensitive Scan Design (LSSD) circuits, and more specifically relates to low power LSSD flip flops and a flushable single clock splitter for flip flops.

2. Background Art

Flip Flops are common devices that are used to allow data to be latched and propagated. A common type of D Flip Flop (DFF) apparatus is shown in FIG. 8. DFF apparatus 600 comprises a multiplexor (MUX) 610 having outputs 611, a Master Latch (ML) 620 having outputs 613 and 614, and a Slave Latch (SL) 630 having a Scan Out (SO) output. The ML is often referred to as latch "L1" and the SL is often referred to as latch "L2". DFF apparatus 600 also comprises a Scan In (SI) input, a Scan Enable (SE) input, a Data (D) input, and an Edge (E) clock input. The MUX 610 has an inverter I1 and two drivers D1 and D2. The ML 620 has inverters I7, I2, I3, and I8, and transistors T1 and T2. The SL 630 has inverters I4, I5, and I6 and has transistors T5, T6, and T7. The SE signal determines whether data input or scan in input information will be latched into the ML, and the edge clock determines when the output 611 will be latched. As is known in the art, by connecting the SO of one DFF apparatus with the SI of another DFF apparatus, data may be serially passed through many of these apparatuses.

Thus, the DFF apparatus of FIG. 8 is functional yet allows some testing. To improve on the testing aspect of these devices, Level Sensitive Scan Design (LSSD) was implemented. LSSD is a design methodology that allows many elements to be functionally tested before a semiconductor chip is used. In particular, for DFF apparatuses, three clocks are used for LSSD: the A, B, and C clocks. Each of these clocks provide certain testing benefits, which will be discussed in reference to the next figures.

In FIG. 9, another prior art DFF apparatus 900 is shown. In this apparatus 900, the ML (latch L1) 920 has an output 911 that is the input to the SL (latch L2), which has its own scan out output. Clock splitter 940 comprises a NAND gate and three AND gates. Generally, there would be one clock splitter 940 for many DFF apparatuses, and the ZB and ZC clocks would be distributed to these apparatuses. The MLE is a Master Latch Enable that allows the ML to be enabled independently from the SL. The EN is an enable signal that enables the edge (E) clock to propagate to both the ML and the SL. The A clock causes data on the SI input to be latched into the ML. The B clock causes data on the output 911 to be latched from the ML to the SL. The C clock causes data on the D input to be latched into the ML. Thus, the LSSD implementation of a DFF, as shown in FIG. 9, allows the DFF apparatus' function to be tested yet allows normal operation.

The DFF apparatus 900 of FIG. 9 provides a further testing operation called a flush. In a flush, data is transferred directly from the SI input to the SO output. When A=B=1, or a high logic value, a scan flush is enable that "flushes" data from the SI input to the SO output.

In FIG. 10, another DFF apparatus 1000 is shown. This apparatus 1000 is identical to the DFF apparatus of FIG. 8 except in the clocking of the L1 and L2 latches. To support the flush operation, this DFF apparatus 1000 comprises a slightly different clock splitter 940. In particular, an OR gate is used instead of the third AND gate of FIG. 9 and the A clock is used in place of the MLE. When A=B=1 or a logic high value and C=0 or a logic low value, a scan flush is enabled that "flushes" data from the D input to the SO output (if SE=0) or from the SI input to the SO output (if SE=1).

One of the advantages that the apparatuses of FIGS. 9 and 10 have over the apparatus of FIG. 8 is that operation using test clocks A, B, and C is independent of layout or other timing-related parameters, provided that the individual test clock pulses are sufficiently separated in time from each other.

Unfortunately, there are certain problems associated with these DFF apparatuses. What is needed are flip flops and a flushable single clock splitter for flip flops that overcome these problems.

DISCLOSURE OF THE INVENTION

The preferred embodiments of the present invention reduce power in flip flop apparatuses by providing flip flop apparatuses that have fewer clock trees than prior art flip flops yet still support some or all of the Level Sensitive Scan Design (LSSD) functionality. In preferred embodiments of the present invention, one clock tree is used instead of two to provide lower power, and less switching devices in clocks splitters are used, which also provides lower power. Additionally, a flushable single clock splitter is provided that allows one clock tree to be used up to the flushable single clock splitter and provides two clocks on the output of the flushable single clock splitter. This saves some power yet still allows for dual clock flip flop designs.

The foregoing and other features and advantages of the present invention will be apparent from the following more particular description of the preferred embodiment of the invention, as illustrated in the accompanying drawings.

BRIEF DESCRIPTION OF THE DRAWINGS

FIG. 12 is a flushable single clock splitter in accordance with a preferred embodiment of the present invention;

FIG. 13 is a timing diagram for the circuit in FIG. 12;

FIG. 14 is a functional truth table for the circuit in FIG. 12;

BEST MODE(S) FOR CARRYING OUT THE INVENTION

As discussed above, the preferred embodiments of the present invention relate to flip flop apparatuses. A more complete discussion of the problems associated with these flip flop apparatuses follows in the Overview section. Because of the particular problems associated with these apparatuses, the Overview section is important in order to best understand the benefits and advantages of the present invention, as well as how the present invention solves these problems.

1. Overview

Figure 8:
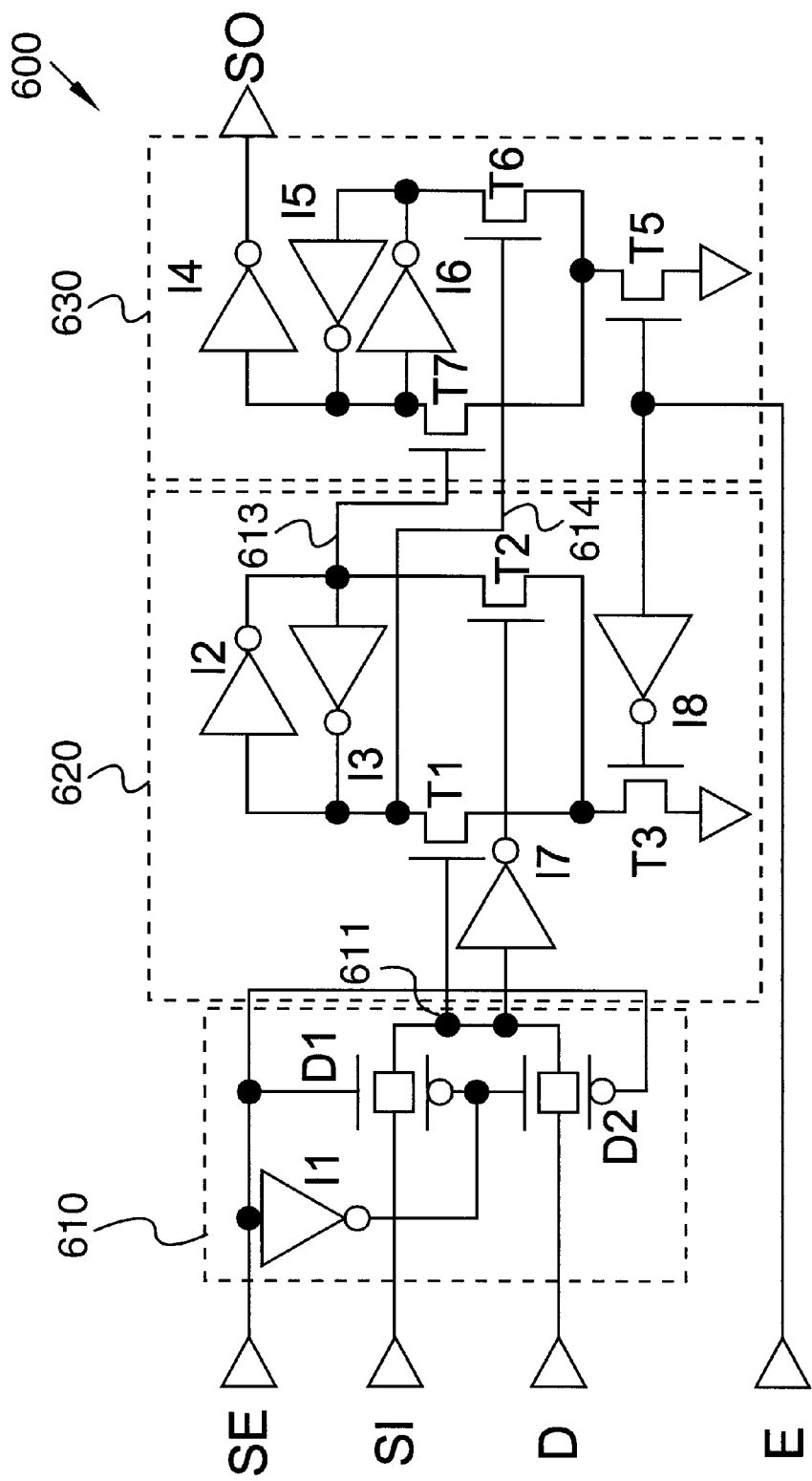
FIGS. 8 through 10 are prior art flip flop apparatuses.

Returning to FIGS. 8, 9 and 10, during normal operation the Level Sensitive Scan Design (LSSD) A, B and C clocks are held at particular logic values (low, high and high logic values, respectively). When operated using the Edge (E) clock input, the apparatuses of FIGS. 9 and 10 consume more power than does the apparatus of FIG. 8.

Figure 9:
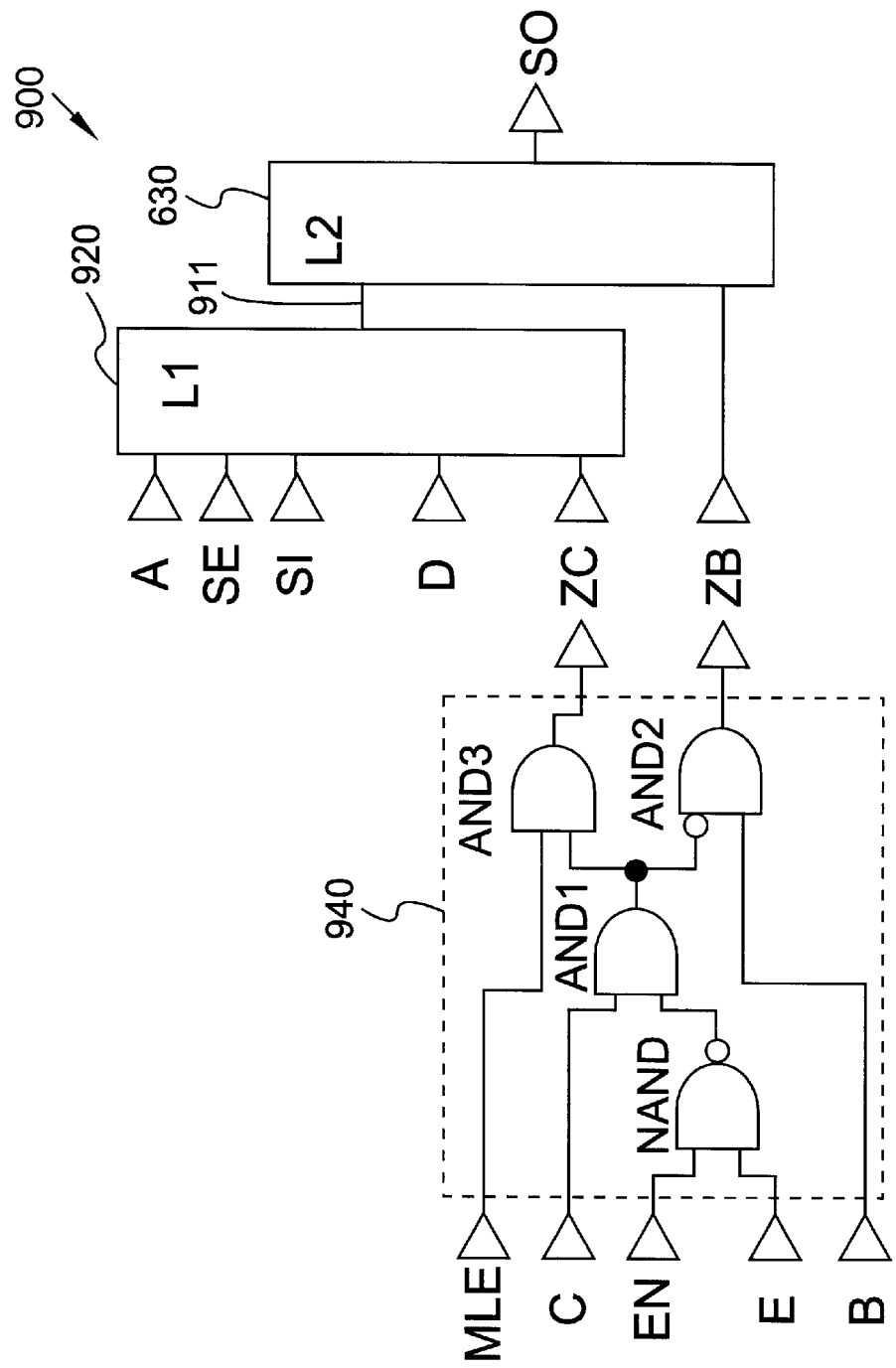
Figure 10:
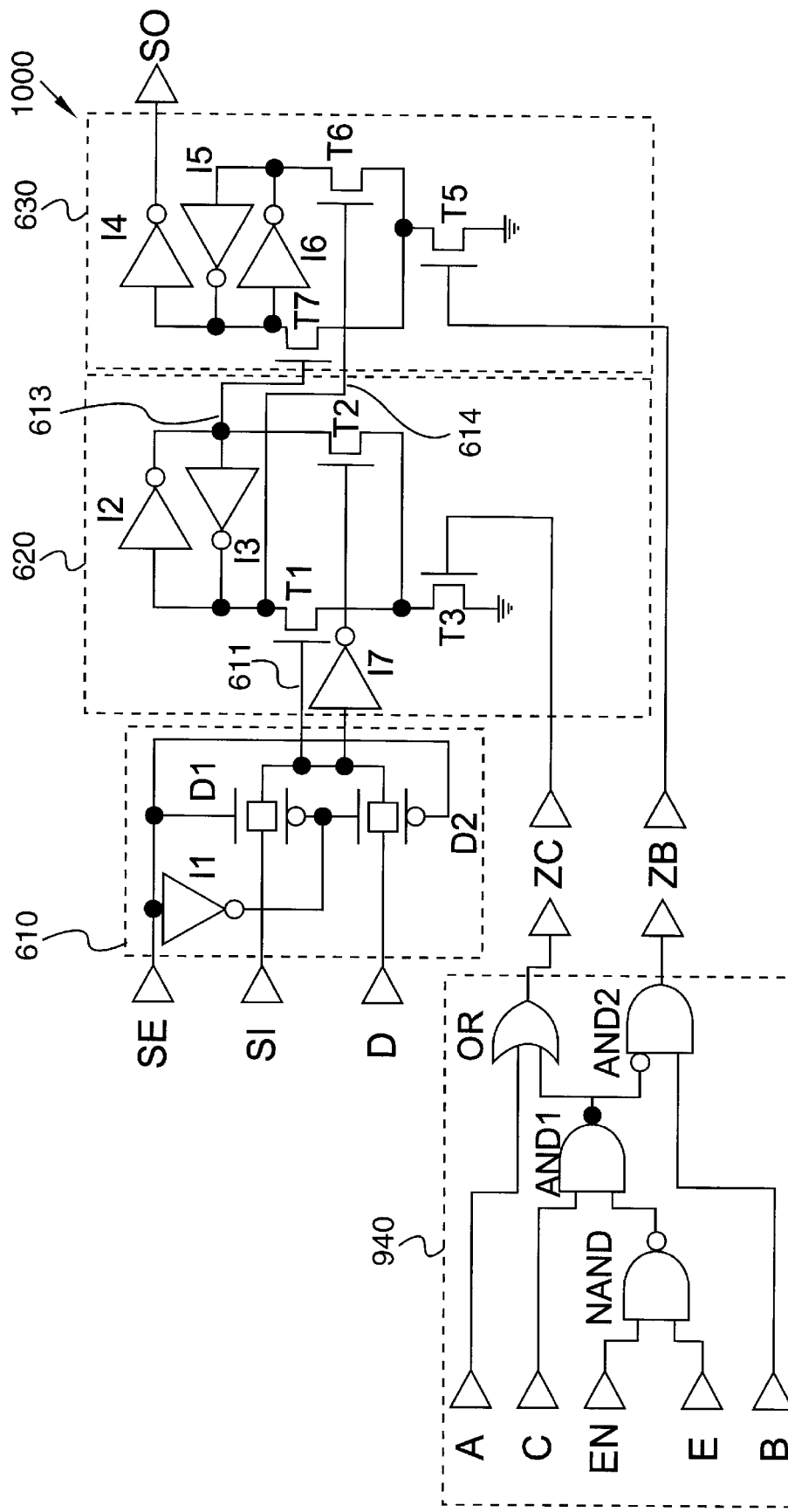

Any transition of the E clock input, in FIGS. 9 and 10, causes a transition at the output of each of the four gates in the clock splitter 940. Furthermore, if one clock splitter 940 is shared among many D Flip Flops (DFFs), two clock signals ZC and ZB switch in response to each transition of the edge clock. Every transition at every node consumes energy.

Figure 17:
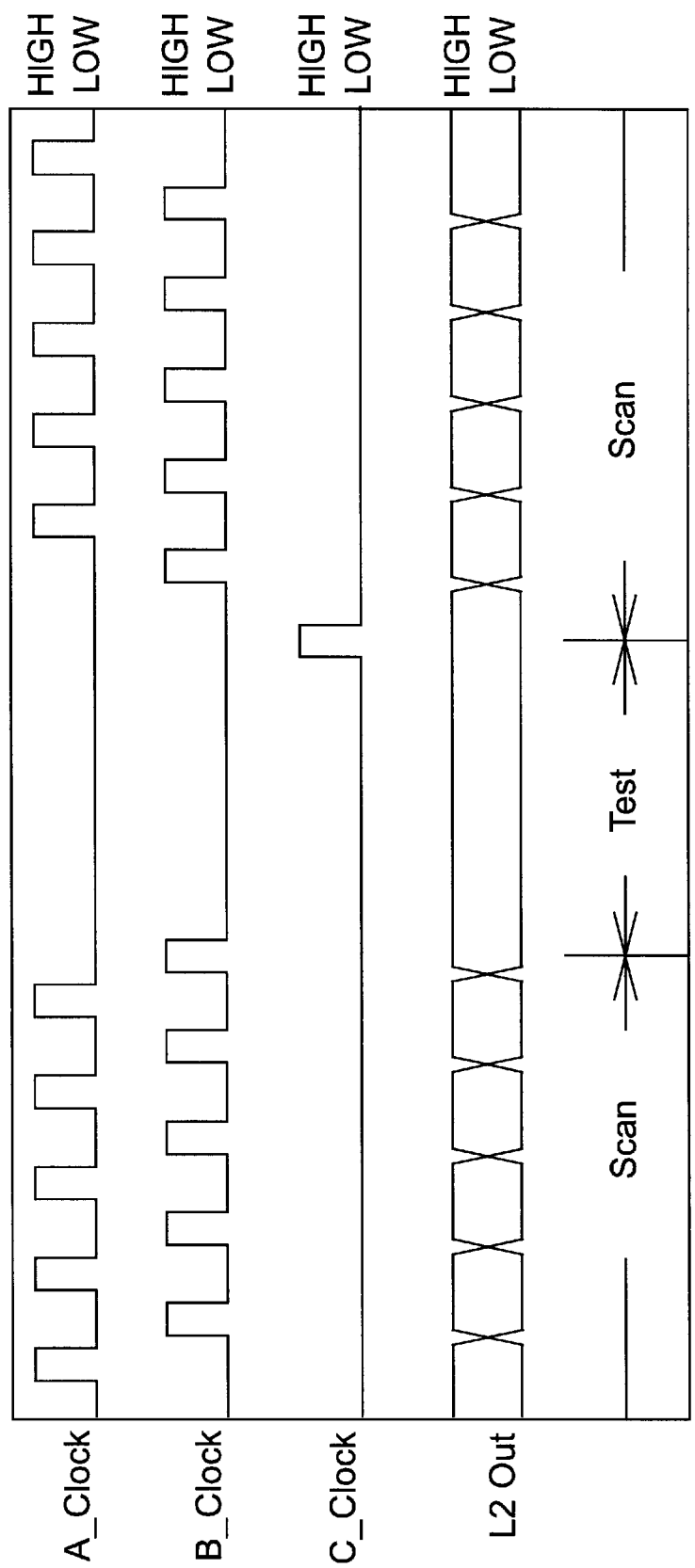
FIG. 17 a prior art timing diagram for a flip flop apparatus.

Referring now to FIG. 17, this figure shows a timing diagram from a prior art DFF apparatus. During a scan operation, each of the A, B and C clocks is switching. Additionally, the latch L2 output (also called the Scan Out, SO, output) is switching. All of these switching events lead to higher power requirements during testing.

Thus, what is needed are flip flops that have the test characteristics—flush operation and layout-independent operation—afforded by the LSSD DFFs of FIGS. 9 and 10 with lower energy consumption during normal edge clocked operation.

2. Detailed Description

The preferred embodiments of the present invention reduce power in flip flop apparatuses by providing flip flop apparatuses that have fewer clock trees than prior art flip flops yet still support some or all of the Level Sensitive Scan Design (LSSD) functionality. In preferred embodiments of the present invention, one clock tree is used instead of two to provide lower power, and less switching devices in clocks splitters are used, which also provides lower power. Additionally, a flushable single clock splitter is provided that allows one clock tree to be used up to the flushable single clock splitter and provides two clocks on the output of the flushable single clock splitter. This saves some power yet still allows for dual clock flip flop designs.

It should be noted that embodiments of the present invention support most or all of the LSSD clocks and may also, depending on the embodiment, support the flush path. As is known in the art, the A clock causes data on the SI input to be latched into the ML. The B clock causes data on the output of the ML to be latched from the ML to the SL. The C clock causes data on the D input to be latched into the ML. In a flush, data is transferred directly from the SI input to the SO output. This occurs when A=B=1 or a logic high value and C=0 or a logic low value. This scan flush operation flushes data from the D input to the SO output (if the scan enable is a particular value) or from the SI input to the SO output (if the scan enable is another value).

Figure 1:
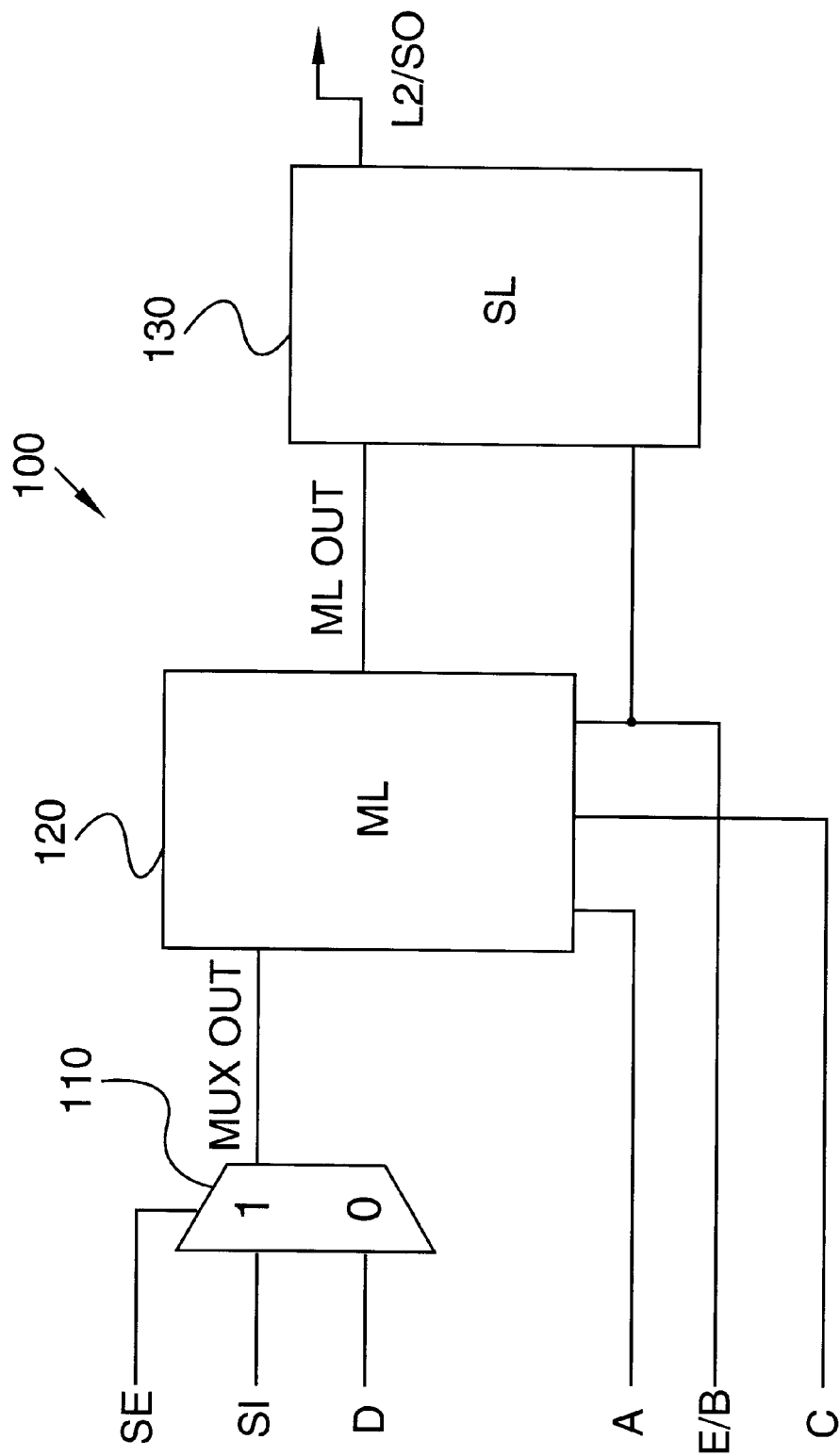
FIGS. 1 and 2 are block diagrams of flip flop apparatuses in accordance with preferred embodiments of the present invention.

Referring now to FIG. 1, a flip flop apparatus 100 is shown. Flip flop apparatus 100 comprises a multiplexor 110 that has an output and a D Flip Flop (DFF) that comprises Master Latch (ML) 120 and Slave Latch (SL) 130. It should be noted that the ML is commonly called latch L1 and the SL is commonly called L2. The MUX output is an input to the ML120 and the ML 120 produces an output that is an input to the SL 130. In this embodiment, A, B, and C clocks can be supported, although all are not necessary. During normal operation, the B clock is the only clock used to latch data from the D input into and through the DFF. Thus, the B clock may be called the "E/B" clock, as it performs the function of a B clock and also the edge (E) clock. Most importantly, during normal operation, there is only one clock tree (the B clock tree, shown more particularly in FIG. 3) that will be used. This provides a dramatic reduction in power as compared to prior art flip flop apparatuses.

Figure 2:
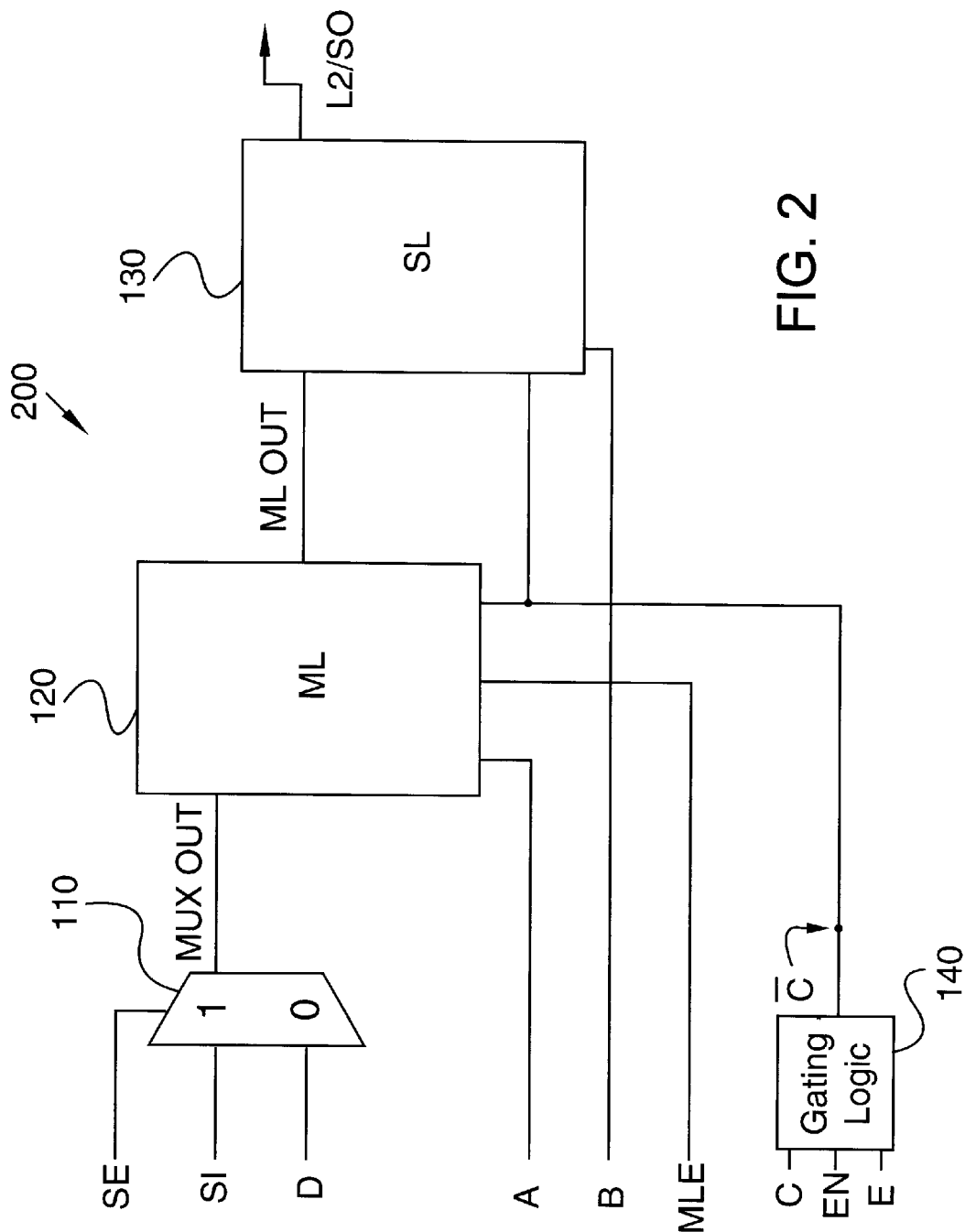

Referring now to FIG. 2, a second preferred embodiment of the present invention is shown. FIG. 2 shows a flip flop apparatus 200 that again comprises a MUX 110, and a ML 120 and a SL 130 that are designed a bit differently than are the ML and SL of FIG. 1. Additionally, gating logic 140 is provided in place of a normal clock splitter. A clock splitter, as shown in FIGS. 9 and 10, generates two clocks from several inputs. In the embodiment of FIG. 2, gate logic is used to generate a single clock (preferably an inverted C clock) from several inputs. In this embodiment, more LSSD clocks and other functions are supported. In particular, the A, B and C clocks are supported, as are the Master Latch Enable (MLE), enable (EN) and edge clock. Again, only one clock tree (preferably an inverted C clock tree) is used to clock data through the DFF comprised of the ML and the SL. It should be noted that it is common to refer to the ML and a SL together as a Shift Register Latch (SRL).

Figure 3:
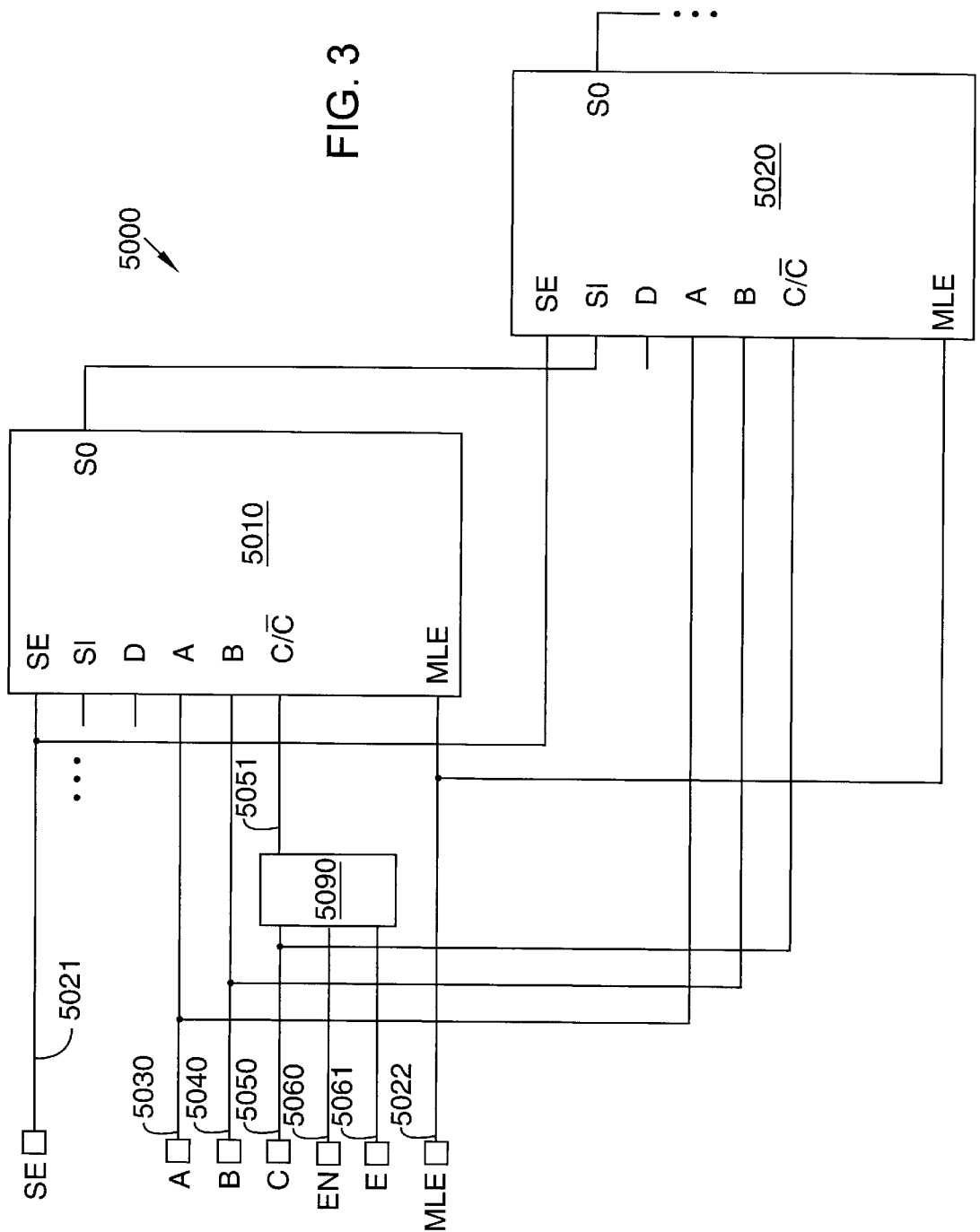
FIG. 3 is a system of flip flops in accordance with a preferred embodiment of the present invention.

Turning now to FIG. 3, a system of flip flops in accordance with a preferred embodiment of the present invention is shown. System 5000 of flip flops contains a number of flip flops 5010, 5020. Generally, 10 to 20 flip flops would be connected in this manner. In FIG. 3, only two flip flops are shown. Each flip flop 5010, 5020 is preferably connected to the following trees when the embodiment of FIG. 1 is used: the SE tree 5021, A clock tree 5030, C clock tree 5051, and B clock tree 5040. If the embodiment of FIG. 2 is used, each flip flop 5010, 5020 will be connected to the A clock tree 5030, B clock tree 5040, and the MLE control tree 5022. Additionally, each group of flip flops 5010, 5020 can have separate gating logic 5090 that generates an inverted C clock tree 5051 from a C clock tree 5050, an enable (EN) clock tree 5060, and an edge (E) clock tree 5061.

One of the benefits of the system 5000 of FIG. 3 is that only one clock tree is active during normal operation. For instance, in the invention of FIG. 1, clock tree 5040 is the only clock tree being used. In the invention of FIG. 2, clock tree inverted C 5051 is the only clock tree being used. In the prior art of FIGS. 9 and 10, two clock trees were used during normal operation. Having only one clock tree in use to run a number of flip flops uses less power. Moreover, less switching devices are needed in the gating logic 5090 because of the fewer clock outputs that are produced by the gating logic. Thus, an additional power decrease is realized.

Figure 4:
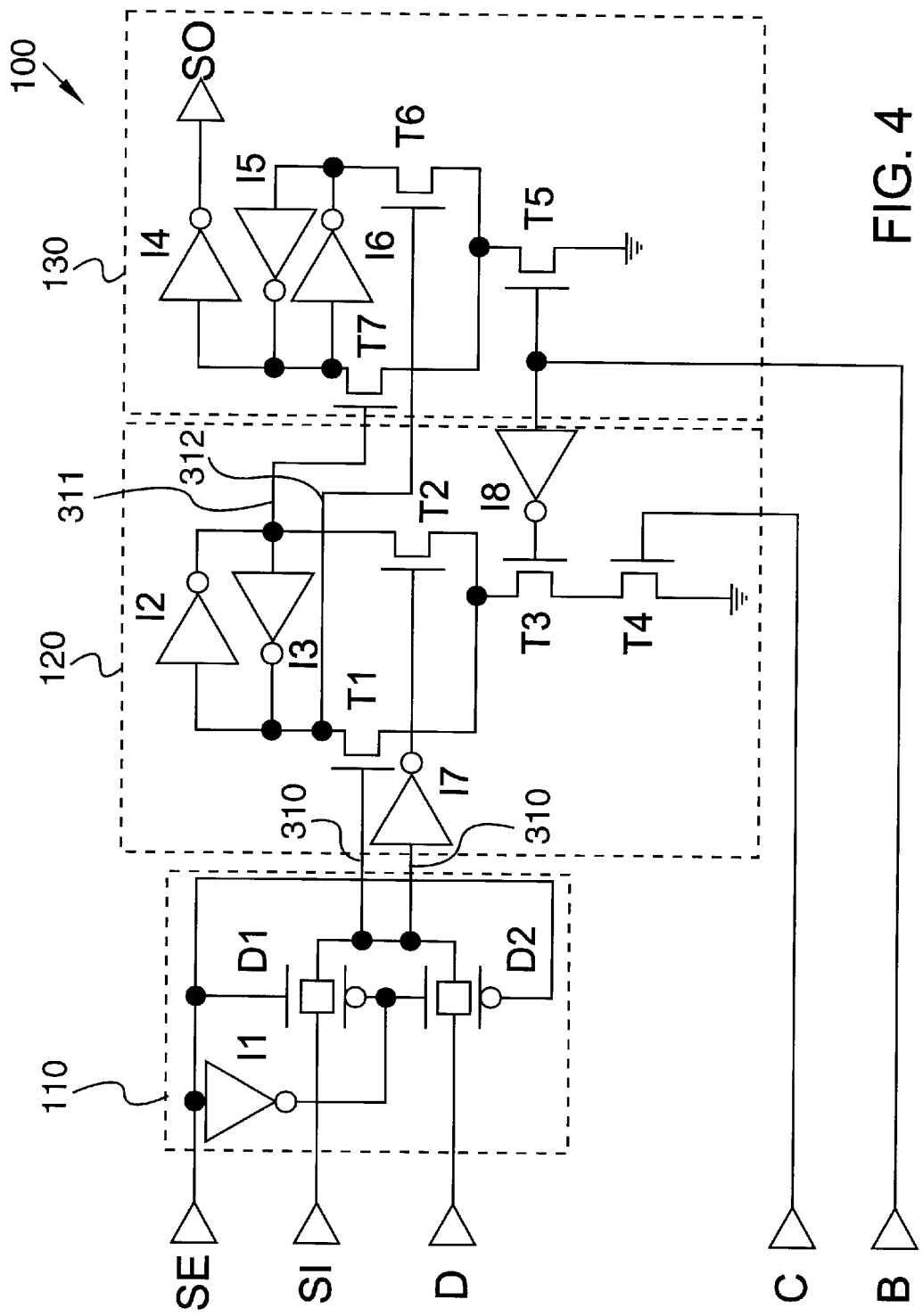
FIGS. 4 through 7 are flip flop apparatuses in accordance with preferred embodiments of the present invention.

Turning now to FIG. 4, this figure illustrates a flip flop apparatus 100 in accordance with a preferred embodiment of the present invention. In this embodiment, there is a MUX 110 and a flip flop comprising the ML 120 and the SL 130. The MUX 100 comprises an inverter I1 and two drivers D1 and D2. Drivers D1 and D2 each preferably contains one P-channel transistor and one N-channel transistor. The MUX provides an output 310 that can be two outputs, depending on how these are wired. The ML 120 comprises an inverter I7 that inverts the ML output 310, transistors T1, T2, T3, and T4, and inverters I2, I3 and I8. SL 130 comprises transistors T7, T6, and T5, and inverters I4, I5, and I6. The SL 130 comprises a SO output. The ML 120 has two outputs 311 and 312. Output 312 is an inverted version of output 311. If desired, output 311 can be inverted to create output 312.

The MUX 110 is responsive to the SE signal to selectively generate the MUX output signal 310 from the data input signal and the scan in signal. In the example of FIG. 4, a logic high value on the SE signal selects the SI signal and a logic low value selects the data (D) input. Alternatively, the MUX may be designed such that a logic low value on the SE signal selects the SI signal and a logic high value selects the data (D) input.

The ML 120 is responsive to the B and C clock signals to generate the ML output signal from the MUX output signal; similarly, the SL is responsive to B clock signal to generate the SL output signal from the ML output signal. In this example, when the B clock signal is active, which in this case is a high logic level, transistor T5 will be active and transistor T3 will be inactive. The SL will latch the data on outputs 311, 312 through transistors T6 and T7. Assuming that outputs 311 and 312 are stable and holding their respective values, only one of the transistors T6 or T7 will be active at one time. One of these transistors will pull down one of the nodes connected to inverters I5 and I6 to latch data into the SL 130. For instance, if output 311 is a low logic level, T7 will be off and T6 will be activated, as output 312 should be a high logic level. Transistor T6 will pull the non-inverted node of inverter I5 down to ground, the inverter I5 will create a high logic level at its inverted node, and inverter I4 will invert this to create a low logic level on the SO output.

When the C clock is active, which in this case is a high logic level, transistor T4 will be active. When the B clock is inactive, which in this case is a low logic level, the inverter I8, which produces an inverted B clock signal, will activate transistor T3. In this scenario, the SL 120 is latched with the data on 310, such that the output 311 also will contain the data on 310. For example, if output 310 contains a high logic level, transistor T1 will be activated, pulling down to ground the non-inverted node of inverter I2. Transistor T2 will be inactive because inverter I7 inverts the value of output 310. The inverter I2 then inverts the ground to create a high logic level on output 311.

During normal operation, the C clock is held high and the B clock is used as the system edge clock. During normal operation, there is only one clock tree that will be used, thus providing lower power over prior art circuits. During testing, the C clock and B clock will be made appropriate values in order to test the various latches. The flip flop apparatus of FIG. 4 does not provide the ability to sensitize a flush delay path from SE to SO. Additionally, it does not allow the propagation of the edge clock to be independently gated. However, these types of functionality may be added to the flip flop apparatus, as shown below.

Figure 5:
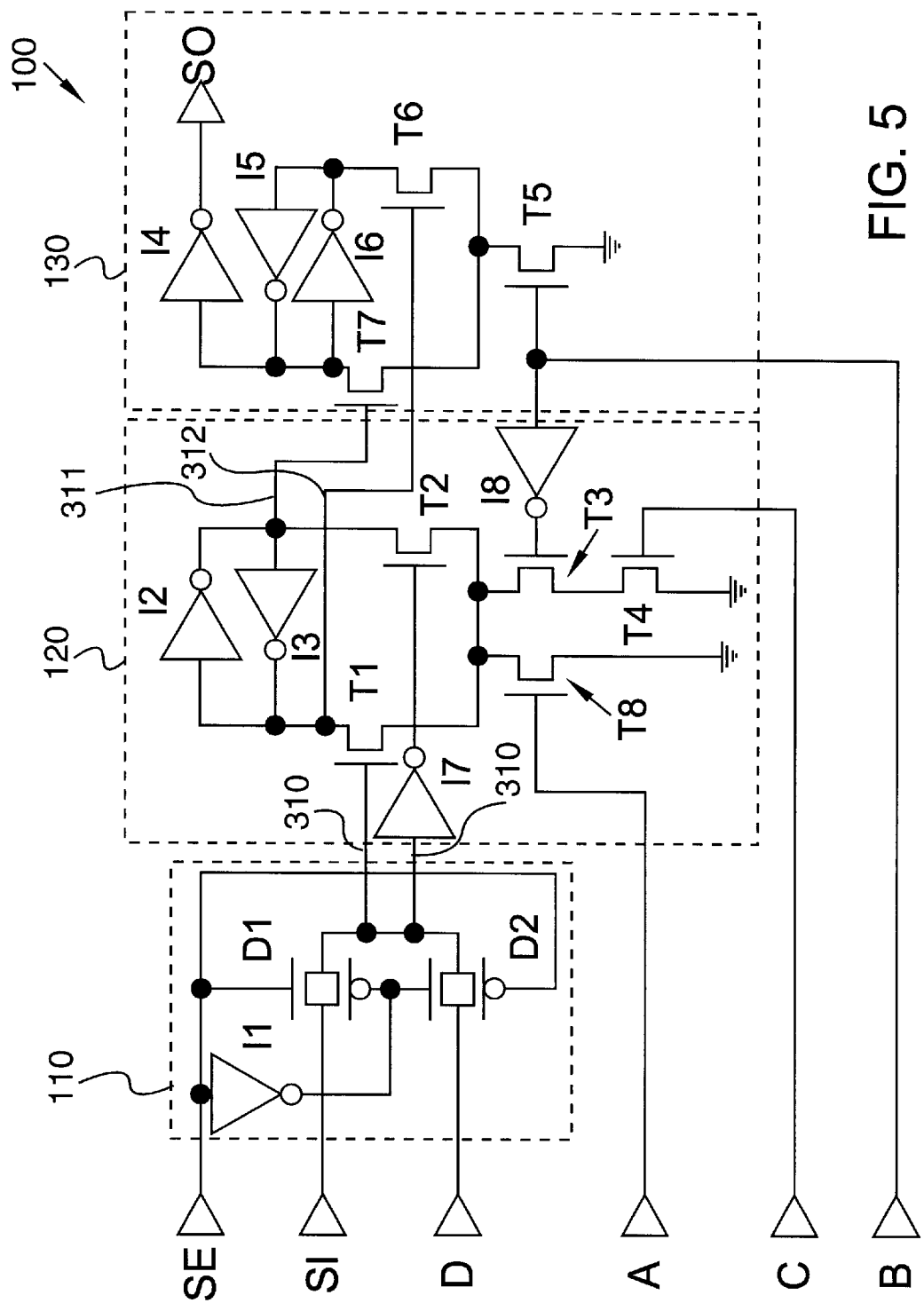

Referring now to FIG. 5, a flip flop apparatus 100 is shown that provides the ability to sensitize a flush delay path and to add A clock functionality. Most of the elements of FIG. 5 are the same as FIG. 4, thus only the differences will be discussed herein. The ML 120 comprises another transistor T8, which is connected to the A clock. A flush delay path is sensitized when A=B=1 and SE=1. When the A clock is a high value, transistor T8 is active, grounding the point connecting T1 with T2. The ML operates as discussed previously.

During normal operation, the C clock will be held to a high logic value, the A clock will be held to a low logic value, and the B clock will be used as the system edge clock. In this manner, only one clock tree—the B clock tree—will be used to enable this flip flop apparatus. Again, this provides a power savings over the prior art flip flops as shown in FIGS. 9 and 10.

Figure 6:
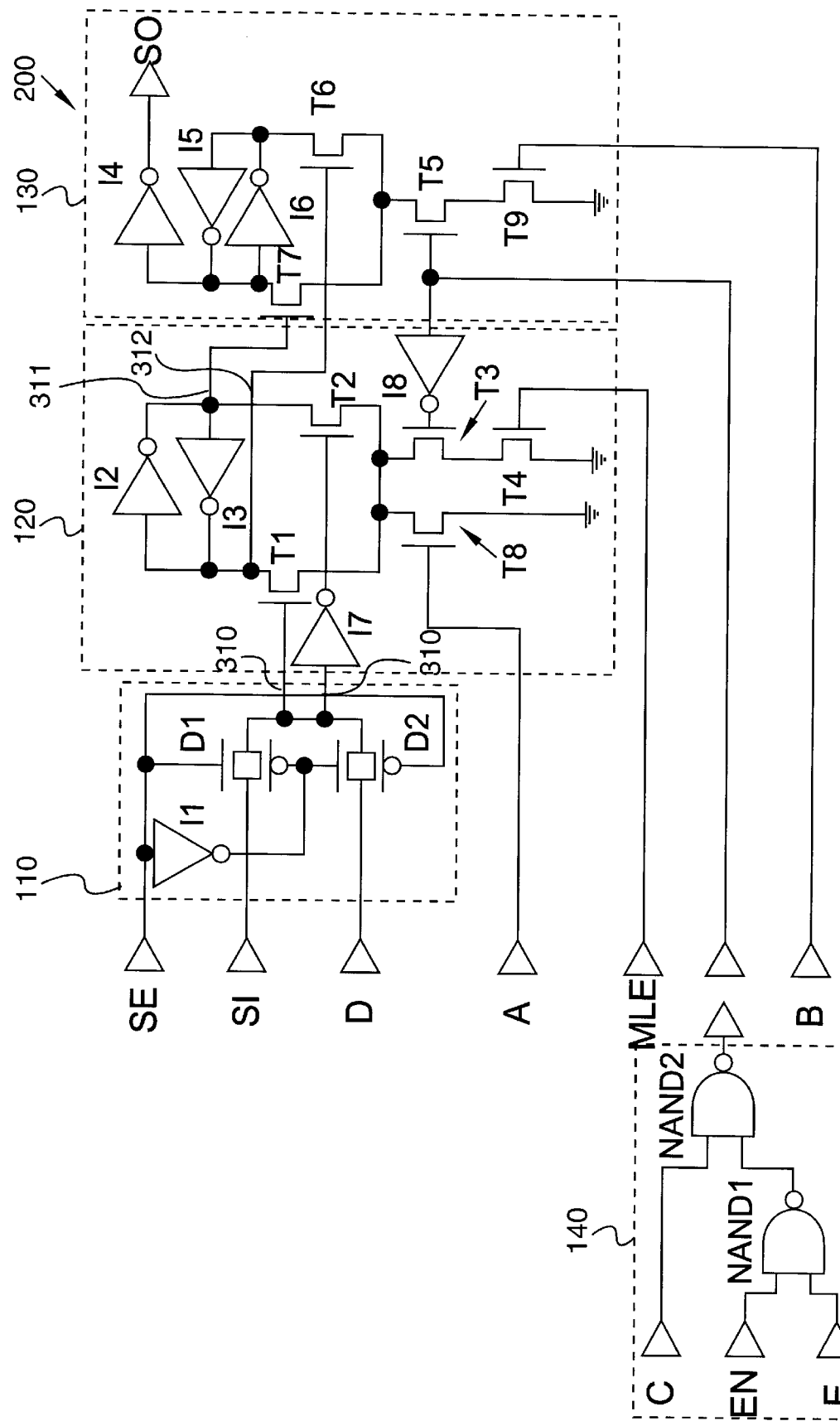

Referring now to FIG. 6, this figure shows a flip flop apparatus that also can independently gate the edge clock. Most of the elements of FIG. 6 are the same as FIG. 5, thus only the differences will be discussed herein. In this embodiment, another transistor T9 is added to the SL 130 and controlled by the B clock. Additionally, a MLE signal is routed to transistor T4, which allows the MLE signal to control the ML, although the A clock can override this. An inverted C clock is applied to the non-inverted input of inverter I8 and the control input of transistor T5. The inverted C clock will be active in this example by having a low logic level placed on the clock signal. The A, B and inverted C clocks are controlled by the A, B, and C clocks as in a prior art system.

Clock gating logic 140 is optional but preferred. Clock gating logic 140 allows the inverted C clock to be created from the C clock, enable signal (EN) and edge (E) clock. Preferably, two NAND gates are used to allow these inputs to generate the inverted C clock. During normal operation, the C clock would be held to a high logic level, as would the B clock. However, the A clock would be held to a low logic level. The MLE would be enabled, which would in this case be held to a high logic level. When the enable (EN) signal is high, the E clock can propagate through the two NAND gates to control the inverted C clock and thereby cause data to be latched into and through the flip flop apparatus 200. In the example of FIG. 6, there are only two switching devices and one clock tree (the inverted C clock tree) that are used. As compared to the prior art of FIGS. 9 and 10, there are two fewer devices and one fewer clock tree that will be switching during normal operation. This should result in a much lower power. It should be noted that the term "devices" as used herein is only referring to the major devices such as a NAND gate. As is known in the art, these gates are made of a number of transistors and other elements, and these other elements are actually doing the switching during clock transitions.

Thus, the flip flop apparatus 200 of FIG. 6 provides all of the LSSD functionality, including a flush path. The flush path is activated when A=B=1, inverted C=1, and SE=1.

Figure 7:
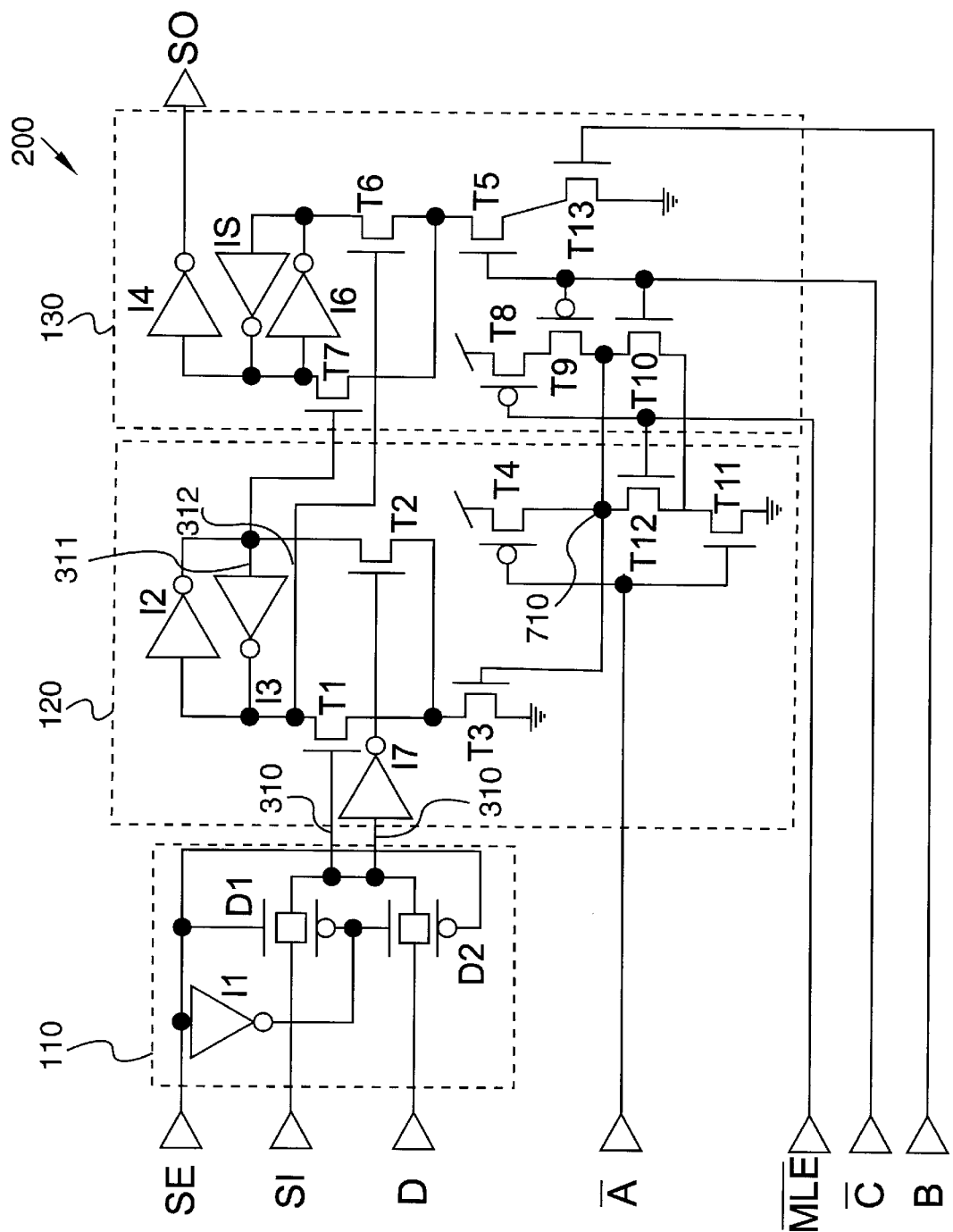

FIG. 7 illustrates another flip flop apparatus 200. In this version, the MUX 110, ML 120, and SL 130 are configured slightly differently. ML 120 comprises transistors T3, T4, T12, and T11, along with the previously discussed transistors T1, T2, and inverters I2, I3, and I7. The SL 130 comprises transistors T6, T5, T13, T8, T9 and T10, along with the previously discussed transistors T6 and T7 and inverters I4, I5, I6. An inverted A clock would be connected to an A clock tree (not shown) and is connected to the control inputs of T4 and T11. Inverted C clock is connected to a C clock tree (not shown) and to the control inputs of transistors T5, T9, and T10. The inverted MLE control signal is connected to the control inputs of transistors T8 and T12. The B clock signal is connected to the control input of T13.

When the inverted A clock is a low value, transistor T4 is active and transistor T11 is inactive. Point 710 is pulled high through transistor T4 and transistor T3 is enabled, thereby allowing data to be latched into the ML 120. When the inverted A clock is a high logic value, transistor T11 is enabled and transistor T4 is disabled. If the inverted MLE control signal is a high value, the transistor T12 will be enabled, thereby pulling point 710 to ground and disabling transistor T3. On the other hand, if inverted MLE is a low logic level, transistor T12 will be disabled and transistor T8 will be enabled. During normal operation, when the inverted C clock is a low logic level, the transistor T9 will be enabled, thereby pulling point 710 high. When the inverted C clock is high, transistor T9 will be disabled and transistors T5 and T10 will be enabled, thereby clocking data into the SL 130 (clock B should be a high logic value) and pulling point 710 to ground through transistors T10 and T11.

Thus, FIG. 7 supports the LSSD operational modes, including flush capability. Again, there is only one clock tree, the inverted C clock tree, that is switching during normal operation. Additionally, the clock gating logic 140 of FIG. 6 may be added to the circuit of FIG. 7 to enable all of the functions of FIG. 6. In this embodiment, there would again be only two switching devices, as compared to prior art, and this would reduce power.

The previous embodiments reduce power during normal operation of the flip flops. They reduce power by providing fewer clock trees and devices that will be switched during normal operation. The following embodiments reduce power mainly during testing and also provide a flushable single clock splitter system.

Figure 11:
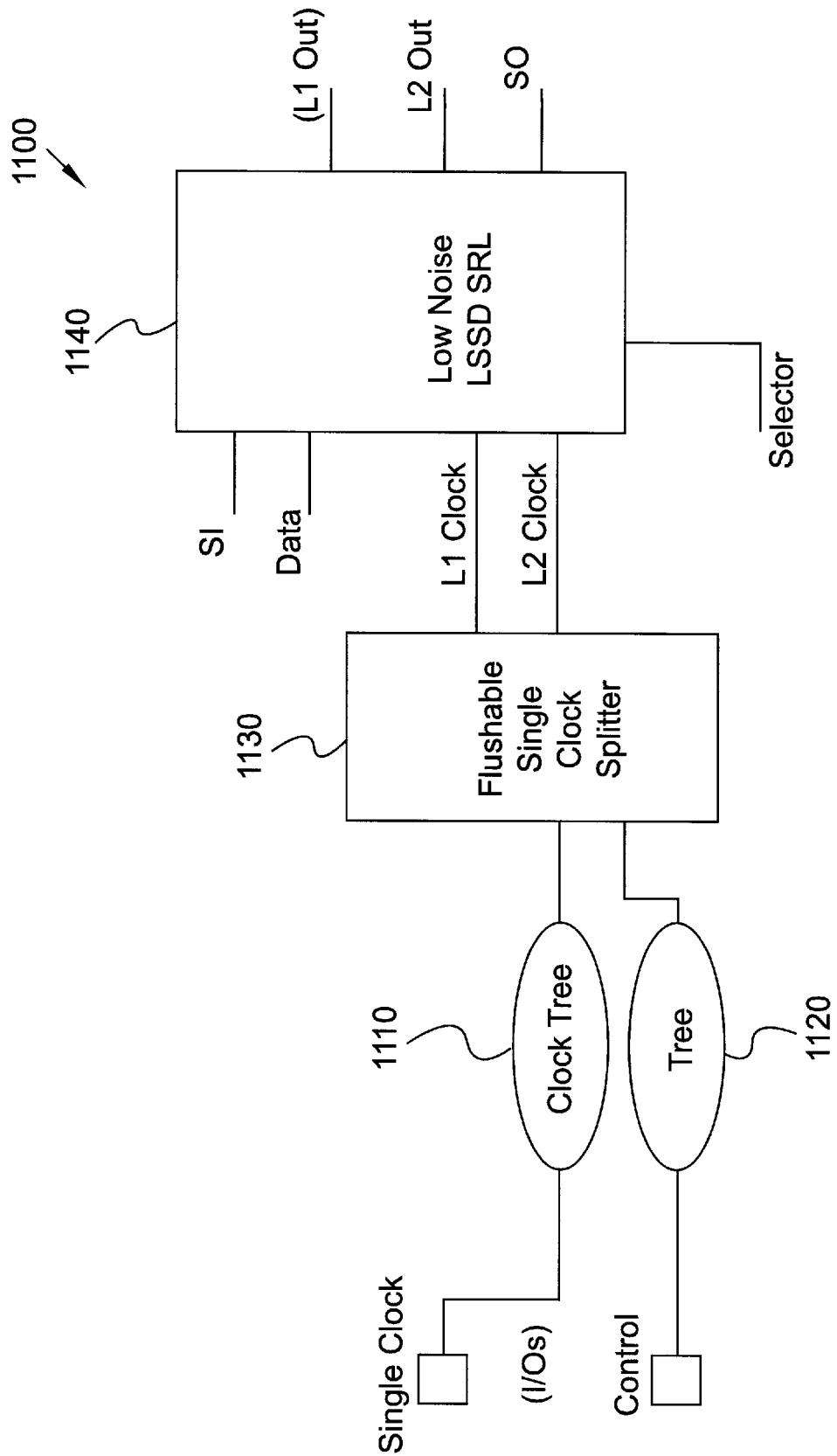
FIG. 11 is a flushable single clock splitter system in accordance with a preferred embodiment of the present invention.

Referring now to FIG. 11, a flushable single clock splitter system 1100 is shown. Flushable single clock splitter system 1100 comprises a single clock that has a clock tree 1110, a control signal that has its own control tree 1120, a flushable single clock splitter 1130, and a low noise Shift Register Latch (SRL) 1140. The term SRL refers to having two latches, an L1 or Master Latch (ML) and an L2 or Slave Latch (SL). The low noise LSSD SRL contains a multiplexor (MUX) and a D flip flop. The flushable single clock splitter provides two phases of clocks, L1 and L2 clocks, from a single input clock. The control signal is used to enable a flush path through the LSSD SRL. In this example, the L1 output is optional and the L2 output and scan out (SO) output are connected to other LSSD SRLs (not shown). Generally, there would be one flushable single clock splitter 1130 for 10 to 20 LSSD SRLs.

Figure 19:
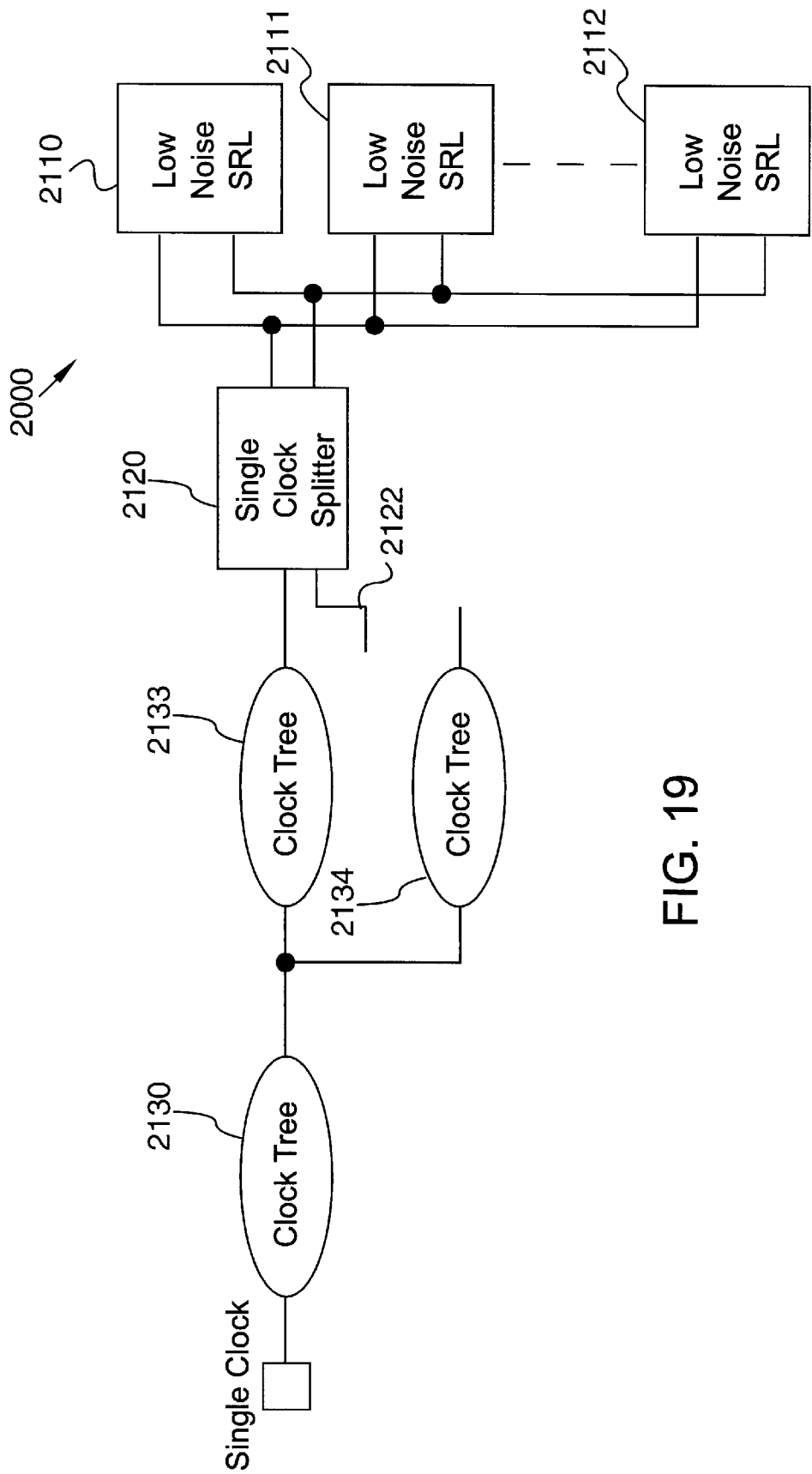
FIGS. 19 and 20 are block diagrams of non-flushable and flushable, respectively, single clock splitter systems in accordance with preferred embodiments of the present invention.
Figure 20:
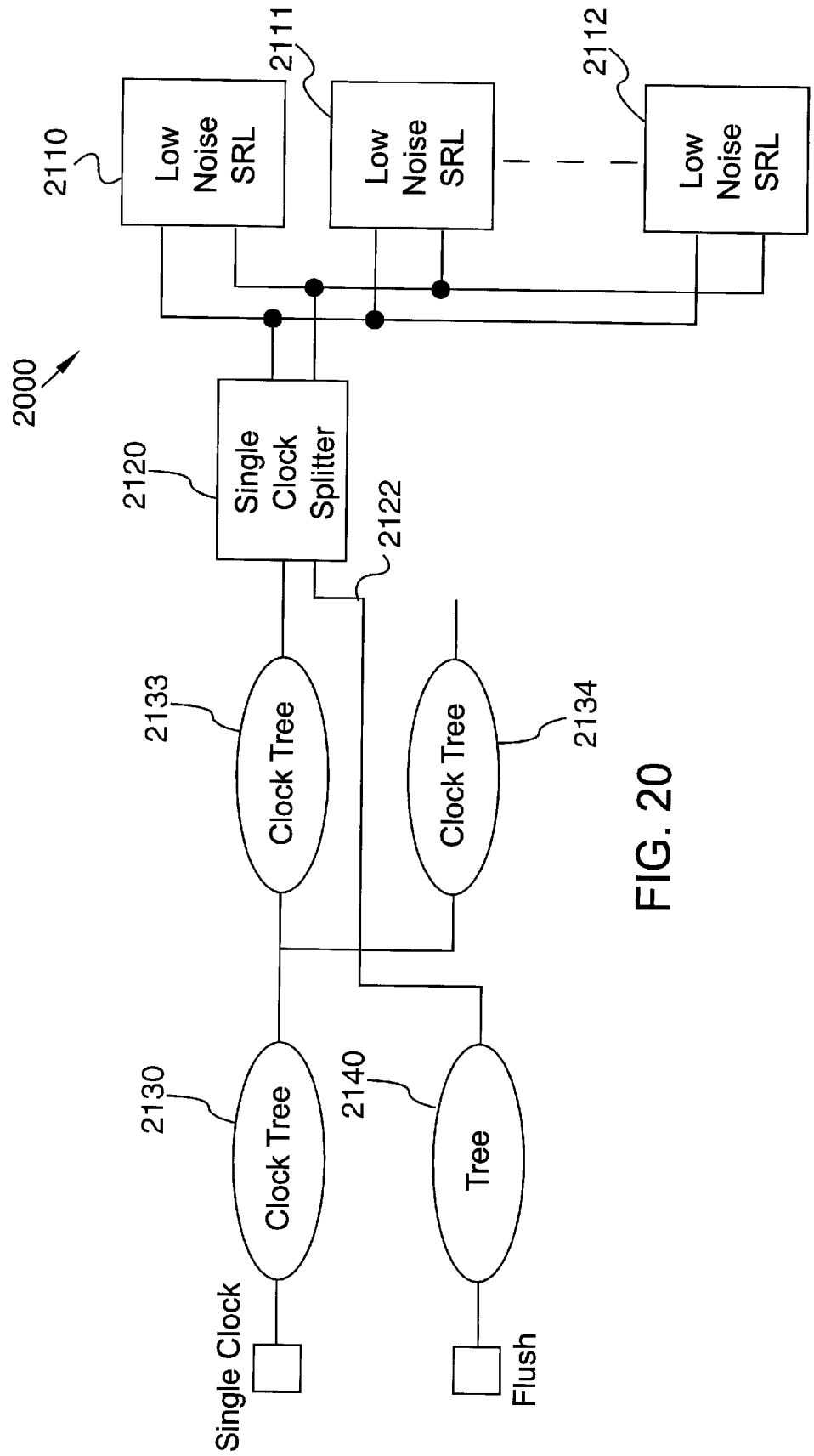

The control signal is optional, but preferred. An example of a flushable single clock splitter system without the control signal is shown in FIG. 19. Flushable single clock splitter system 2000 comprises a number of low noise SRLs 2110, 2111, and 2112, a single clock splitter 2120, a single clock that has a first clock tree 2130 that has an additional several clock trees 2133, 2134. In this example the control signal 2122 is not connected and the single clock splitter 2120 will not be used to enable a flush path. In FIG. 20, on the other hand, the flushable single clock splitter system 2000 comprises a flush control signal that has its own control tree 2140 and that is connected through line 2122 to the single clock splitter 2120. This allows a flush path to be enabled by enabling the flush signal.

A preferred single clock splitter 1130 is shown in FIG. 12. Single clock splitter 1130 comprises inverters I1, I2, and I3, and drivers D1 and D2. Drivers D1 and D2 preferably consist of a P-channel transistor in parallel with an N-channel transistor. To create two clocks from one clock, preferably the single clock is split into two paths, one of which is delayed longer than the other. The drivers D1 and D2 and the inverter I3 can be considered a multiplexor. The multiplexor has first and second data inputs 1131, 1132 and an output (the L2 clock output). The control input acts as a selector to select between having the single clock go through path 1131 (a delayed that is non-inverted) and having the single clock go through inverter I2 and path 1132. The multiplexor is responsive to the selection input to selectively generate the L2 clock output from the first and second data inputs 1131, 1132. The inverter I1 acts as a delay element. The path 1131 through the multiplexor and to the L2 clock output has a different delay that should ideally be less than the delay through the inverter I1.

A timing diagram for the circuit of FIG. 12 is shown in FIG. 13. As can be seen in FIG. 13, the single clock can create a clock pulse. The L1 clock is an inverted and delayed version of this clock pulse. The L2 clock is a non-inverted version of this clock pulse and is not delayed as much as the L1 clock pulse.

Referring to FIG. 14, a logical truth table for the circuit of FIG. 12 is shown. When the flush control signal is a logic low level, the L1 and L2 clocks are split as in FIG. 13. When the flush control signal is a high logic level and the single clock is a high logic level, both of the L1 and L2 clocks are low logic levels. When the flush control signal is a high logic level and the single clock is a low logic level, both of the L1 and L2 clocks are high logic levels, thereby allowing a flush path.

Figure 15:
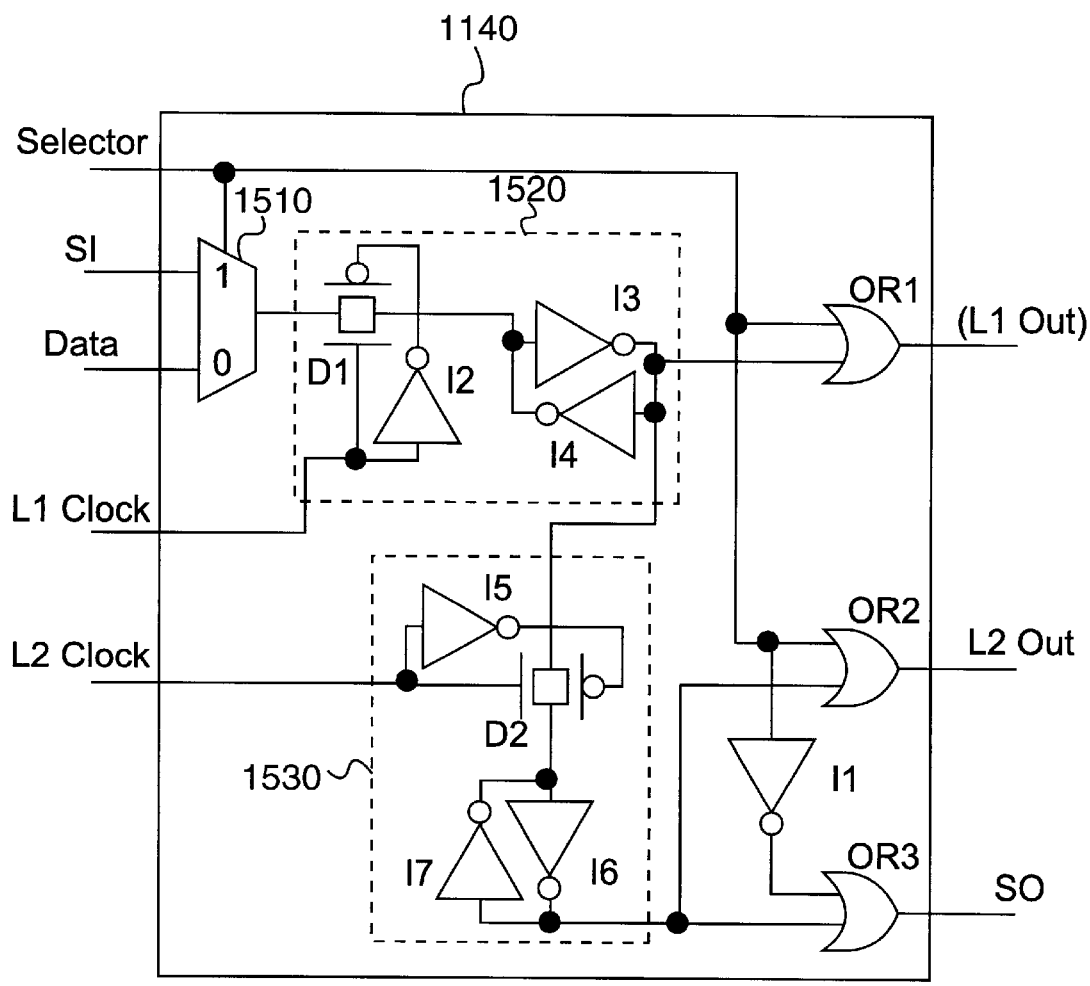
FIGS. 15 and 16 are flip flops flip flop apparatuses in accordance with preferred embodiments of the present invention.

A preferred SRL is shown in FIG. 15. SRL 1140 comprises a MUX 1510, and a D flip flop comprising an L1 latch (or ML) 1520 and an L2 latch (or SL) 1530. The L1 latch 1520 comprises inverters I2, I3 and I4 and a driver D1. The L2 latch comprises inverters I5, I6, and I7 and driver D2. The L1 latch comprises an output that is connected to OR1; the L2 latch comprises an output that is connected to both OR2 and OR3. The selector (also called SE) is connected to the three OR gates and will select the scan in (SI) input when the selector is a high logic value and the data input when the selector is a low logic value. SRL 1140 would be serially connected to other SRLs through the SO output. The L1 and L2 outputs would be sent to the appropriate logic that uses these values.

During normal operation, the selector would be a low logic value and the gates OR1 and OR2 will allow values to pass. However, the inverter I1 will cause the SO output to be consistently high. This will prevent any components to which the SO is connected from being switched, thus saving power. During testing, the selector would be held high and the L2 and L1 outputs will be held high while the SO output will be allowed to switch. This keeps the L2 and L1 output from causing switching on any devices connected to these outputs. This saves power during testing.

Figure 16:
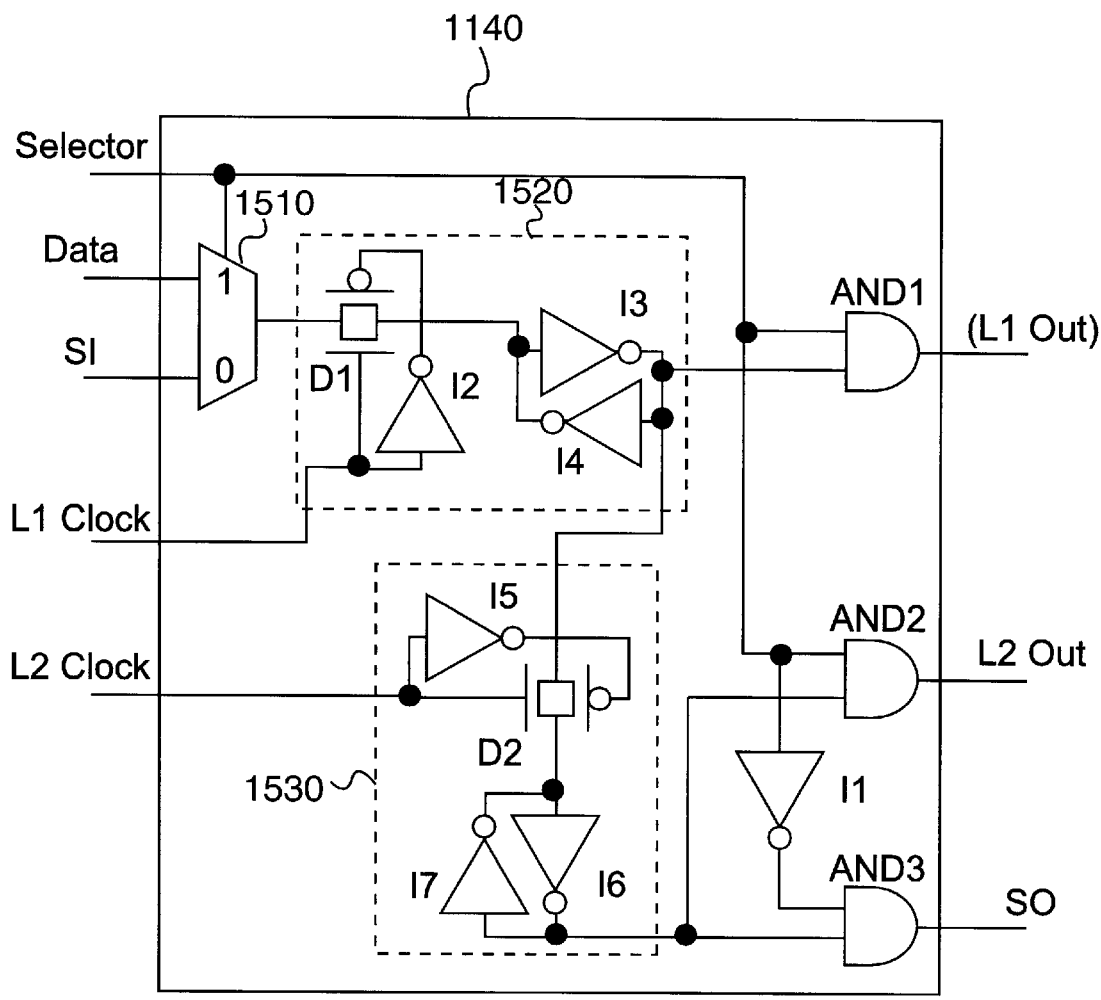

Another preferred SRL is shown in FIG. 16. In this figure, SRL 1140 comprises three AND gates in place of the OR gates of FIG. 15. The selector in this example will be a high logic value to select the data input and a low logic value to select the SI input. When the selector is high, the L1 and L2 outputs are allowed to switch while the SO output is kept low. This is the normal mode of operation and saves power because any devices to which the SO is connected will not be switching. During testing, the selector input is kept low and the L1 and L2 out are also kept low. The SO output is allowed to switch. This reduces power because the L1 and L2 output will not be causing any devices to switch.

Returning to FIG. 13 in addition to FIGS. 15 and 16, the falling edge of the L1 clock turns off driver D1, isolating the inverters I3 and I4 from the output of the MUX 1510. When the L2 clock rises, the data at the output of the L1 latch will be latched into the L2 latch because D2 will be enabled. This data then appears on the SO or L2 outputs, depending on the configuration of the selector. The L2 clock should fall to an appropriate value before the L1 clock rises, or it may be possible for different data to be latched through the L1 latch, through the L2 latch, and to the L2 output or SO output. When the single clock splitter (see FIG. 12) is in flush mode, both the L1 and L2 clocks will be high, enabling data to be flushed directly through the L1 and L2 latches.

Figure 18:
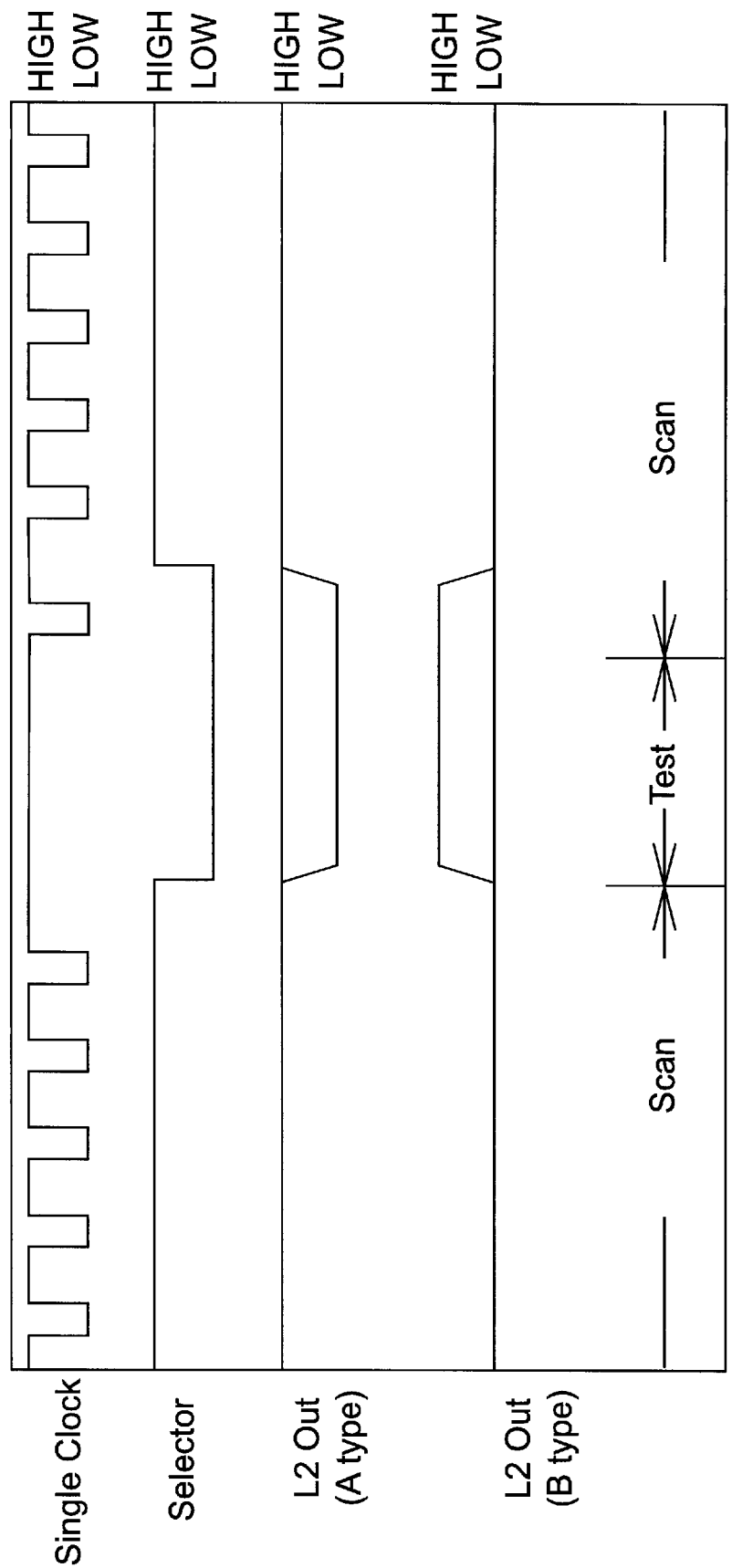
FIG. 18 is a timing diagram for the apparatuses of FIGS. 15 and 16.
Figure 21:
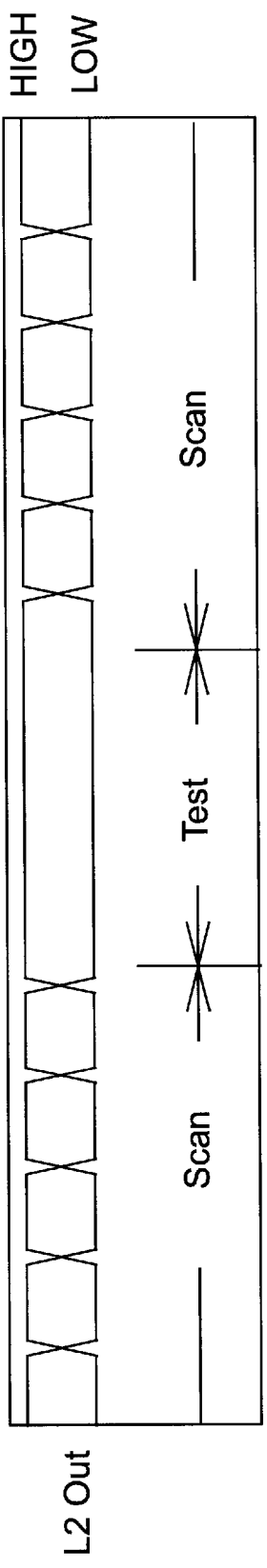
FIG. 21 is a prior art timing diagram for a flip flop apparatus.
Figure 22:
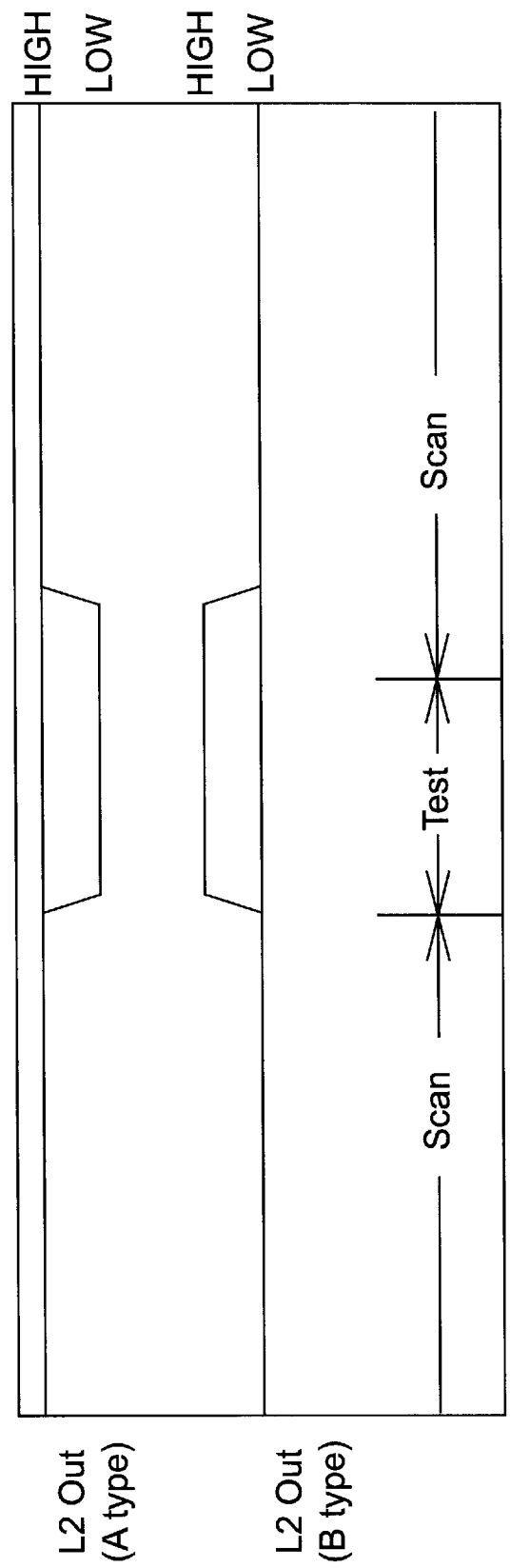
FIG. 22 is a timing diagram for the apparatuses of FIGS. 15 and 16.

Comparing FIG. 18, which is a timing diagram of the system of FIG. 11, with the prior art timing diagram of FIG. 17, it can be seen that the system of FIG. 11 has the same functionality of circuits used to produce FIG. 17. As is better shown on FIGS. 21 and 22, it can also be seen that there is no L2 output switching during scan operation. This allows for faster scan cycle times due to less power dissipation, and also allows test time reduction and therefore cost reduction.

Thus, what has been shown is flip flop apparatuses that reduce power by having fewer clock trees than prior art flip flops yet the apparatuses still support some or all of the Level Sensitive Scan Design (LSSD) functionality. In preferred embodiments of the present invention, one clock tree is used instead of two to provide lower power, and less switching devices in clocks splitters are used, which also provides lower power. Additionally, a flushable single clock splitter is provided that allows one clock tree to be used up to the flushable single clock splitter and provides two clocks on the output of the flushable single clock splitter. This saves some power yet still allows for dual clock flip flop designs.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Similarly, unless otherwise specified, any sequence of steps of the method indicated in the drawings or herein are given as an example of a possible sequence and not as a limitation. Many modifications and variations are possible in light of the above teaching without departing from the spirit and scope of the forthcoming claims.

What is claimed is:

1. A flip flop apparatus comprising:
    a multiplexor (MUX) comprising a Scan Enable (SE) signal, a data input signal, a scan in signal, and a MUX output signal, the MUX responsive to the SE signal to selectively generate the MUX output signal from the data input signal and the scan in signal;
    a master latch (ML) coupled to the MUX output signal and comprising at least two ML clock signals, an inverter, and at least one ML output signal, the ML responsive to the at least two ML clock signals to generate the ML output signal from the MUX output signal; and
    a slave latch (SL) coupled to the at least one ML output signal and comprising a SL output signal and at least one SL clock signal comprising a B clock signal, the SL responsive to the at least one SL clock signal to generate the SL output signal from the ML output signal;
    wherein the inverter of the ML is coupled to the B clock signal of the SL and inverts the B clock signal to create an inverted B clock signal;
    wherein the at least two ML clock signals comprise the inverted B clock signal and a C clock signal;
    wherein the ML is responsive to the at least two ML clock signals by generating the ML output signal from the MUX output signal when both the B clock signal is inactive and the C clock signal is active; and
    wherein the SL is responsive to the at least one clock signal by generating the SL output signal from the ML output signal when the B clock is active.

2. A flip flop apparatus comprising:
    a multiplexor (MUX) comprising a Scan Enable (SE) signal, a data input signal, a scan in signal, and a MUX output signal, the MUX responsive to the SE signal to selectively generate the MUX output signal from the data input signal and the scan in signal;
    a master latch (ML) coupled to the MUX output signal and comprising at least two ML clock signals, an inverter, and at least one ML output signal, the ML responsive to the at least two ML clock signals to generate the ML output signal from the MUX output signal; and
    a slave latch (SL) coupled to the at least one ML output signal and comprising a SL output signal and at least one SL clock signal comprising a B clock signal, the SL responsive to the at least one SL clock signal to generate the SL output signal from the ML output signal;
    wherein the inverter of the ML is coupled to the B clock signal of the SL and inverts the B clock signal to create an inverted B clock signal;
    wherein the at least two ML clock signals comprise the inverted B clock signal and a C clock signal;
    wherein the at least two ML clock signals further comprise an A clock signal;
    wherein the ML is responsive to the at least two ML clock signals by generating the ML output signal from the MUX output signal when both the B clock signal is inactive and the C clock signal is active or when the A clock is active; and
    wherein the SL is responsive to the at least one clock signal by generating the SL output signal from the ML output signal when the B clock is active.

3. A flip flop apparatus comprising:
    a multiplexor (MUX) comprising a Scan Enable (SE) signal, a data input signal, a scan in signal, and a MUX output signal, the MUX responsive to the SE signal to selectively generate the MUX output signal from the data input signal and the scan in signal;
    a master latch (ML) coupled to the MUX output signal and comprising at least two ML clock signals, an inverter, and at least one ML output signal, the ML responsive to the at least two ML clock signals to generate the ML output signal from the MUX output signal; and
    a slave latch (SL) coupled to the at least one ML output signal and comprising a SL output signal and at least one SL clock signal comprising a B clock signal, the SL responsive to the at least one SL clock signal to generate the SL output signal from the ML output signal;
    wherein the at least one SL clock signal comprises an inverted C clock signal and a B clock signal;
    wherein the ML comprises an inverter that is coupled to the inverted C clock signal and that inverts the inverted C clock signal to create a first C clock signal; and
    wherein the at least two ML clock signals comprise the C clock signal, a Master Latch Enable (MLE) clock signal and an A clock signal.

4. The flip flop apparatus of claim 3 wherein the ML is responsive to the at least two ML clock signals by generating the ML output signal from the MUX output signal when both the inverted C clock and the MLE clock signals are active or when the A clock is active, and wherein the SL is responsive to the at least one clock signal by generating the SL output signal from the ML output signal when both the B clock is active and the inverted C clock is inactive.

5. The flip flop apparatus of claim 3 further comprising gating logic comprising inputs of a second C clock signal, an enable signal, an edge clock signal and an output of the inverted C clock signal.

6. The flip flop apparatus of claim 5 wherein the gating logic comprises first and second NAND gates, the first NAND gate having inputs coupled to the enable and edge clock signals and having a first NAND gate output, the second NAND gate having inputs coupled to the second C clock signal and the first NAND gate output, and the second NAND gate's output coupled to the inverted C clock.

7. A system of flip flops comprising:
 a plurality of clock signals comprising B and C clock signals;
 at least one control signal, the at least one control signal comprising a Scan Enable (SE) signal; and
 a plurality of flip flop apparatuses, each of the flip flop apparatuses coupled to the plurality of clock signals and the at least one control signal and comprising:
  a multiplexor (MUX) comprising a data input signal, a scan in signal, and a MUX output signal, the MUX responsive to the SE signal to selectively generate the MUX output signal from the data input signal and the scan in signal;
  a master latch (ML) coupled to the MUX output signal and comprising at least one ML output signal and an inverter, the ML responsive to at least two of the clock signals to generate the ML output signal from the MUX output signal; and
  a slave latch (SL) coupled to the at least one ML output signal and comprising a SL output signal, the SL responsive to at least one of the clock signals to generate the SL output signal from the ML output signal;
 wherein the ML inverter is coupled to the B clock signal and inverts the B clock signal to create an inverted B clock signal;
 wherein the ML is responsive to the B and C clock signals;
 wherein the SL is coupled to and responsive to the B clock signal;
 wherein the ML is responsive to the B and C clock signals by generating the ML output signal from the MUX output signal when both the B clock signal is inactive and the C clock signal is active; and
 wherein the SL is responsive to the at least one clock signal by generating the SL, output signal from the ML output signal when the B clock is active.

8. A system of flip flops comprising:
 a plurality of clock signals comprising B and C clock signals;
 at least one control signal, the at least one control signal comprising a Scan Enable (SE) signal; and
 a plurality of flip flop apparatuses, each of the flip flop apparatuses coupled to the plurality of clock signals and the at least one control signal and comprising:
  a multiplexor (MUX) comprising a data input signal, a scan in signal, and a MUX output signal, the MUX responsive to the SE signal to selectively generate the MUX output signal from the data input signal and the scan in signal;
  a master latch (ML) coupled to the MUX output signal and comprising at least one ML output signal and an inverter, the ML responsive to at least two of the clock signals to generate the ML, output signal from the MUX output signal; and
  a slave latch (SL) coupled to the at least one ML output signal and comprising a SL output signal, the SL responsive to at least one of the clock signals to generate the SL output signal from the ML output signal;
 wherein the ML inverter is coupled to the B clock signal and inverts the B clock signal to create an inverted B clock signal;
 wherein the ML is responsive to the B and C clock signals;
 wherein the SL is coupled to and responsive to the B clock signal;
 wherein the plurality of clock signals further comprise an A clock signal;
 wherein the ML, is responsive to at least two of the clock signals by generating the ML output signal from the MUX output signal when both the B clock signal is inactive and the C clock signal is active or when the A clock is active; and
 wherein the SL is responsive to the at least one clock signal by generating the SL output signal from the ML output signal when the B clock is active.

9. A system of flip flops comprising:
 a plurality of clock signals comprising B and C clock signals;
 at least one control signal, the at least one control signal comprising a Scan Enable (SE) signal; and
 a plurality of flip flop apparatuses, each of the flip flop apparatuses coupled to the plurality of clock signals and the at least one control signal and comprising:
  a multiplexor (MUX) comprising a data input signal, a scan in signal, and a MUX output signal, the MUX responsive to the SE signal to selectively generate the MUX output signal from the data input signal and the scan in signal;
  a master latch (ML) coupled to the MUX output signal and comprising at least one ML output signal and an inverter, the ML responsive to at least two of the clock signals to generate the ML output signal from the MUX output signal; and
  a slave latch (SL) coupled to the at least one ML output signal and comprising a SL output signal, the SL responsive to at least one of the clock signals to generate the SL output signal from the ML output signal;
 wherein the plurality of clock signals comprise an inverted C clock signal, a B clock signal, and an A clock signal;
 wherein the at least one control signal further comprises a Master Latch Enable (MLE) signal;
 wherein the ML comprises an inverter that is coupled to the inverted C clock signal and that inverts the inverted C clock signal to create a first C clock signal;
 wherein the ML, is responsive to the MLE signal, inverted C clock signal, and A clock signal; and
 wherein the SL is responsive to the inverted C clock signal and the B clock signal.

10. The system of flip flops of claim 9 wherein the ML generates the ML output signal from the MUX output signal when both the inverted C clock and the MLE clock signals are active or when the A clock is active, and wherein the SL is responsive to the at least one clock signal by generating the SL output signal from the ML output signal when both the B clock is active and the inverted C clock is inactive.

11. The system of flip flops of claim 9 wherein the at least one control signal further comprises an enable signal, wherein the plurality of clock signals further comprises an edge clock signal, and wherein the system further comprises gating logic comprising inputs of a second C clock signal, an enable signal, an edge clock signal and an output of the inverted C clock signal, the gating logic responsive to the second C clock signal, enable signal, and edge clock signal to generate the inverted C clock signal.

12. The system of flip flops of claim 11 wherein the gating logic comprises first and second NAND gates, the first NAND gate having inputs coupled to the enable and edge clock signals and having a first NAND gate output, the second NAND gate having inputs coupled to the second C clock signal and the first NAND gate output, and the second NAND gate's output coupled to the inverted C clock.

13. A method comprising the steps of:
providing a plurality of clock signals comprising B and C clock signals;
providing at least one control signal, the at least one control signal comprising a Scan Enable (SE) signal;
providing a flip flop apparatus coupled to the plurality of clock signals and the at least one control signal and comprising:
a multiplexor (MUX) comprising a data input signal, a scan in signal, and a MUX output signal;
a master latch (ML) coupled to the MUX output signal and comprising at least one ML output signal; and
a slave latch (SL) coupled to the at least one ML output signal and comprising a SL output signal;
selectively generating the MUX output signal from the data input signal and the scan in signal in response to the SE signal;
inverting the B clock signal;
generating the ML output signal from the MUX output signal by responding to the inverted B clock signal and the C clock signal when both the B clock signal is inactive and the C clock signal is active; and
generating the SL output signal from the ML output signal by responding to the B clock signal when the B clock is active.

14. A method comprising the steps of:
providing a plurality of clock signals comprising A, B and C clock signals;
providing at least one control signal, the at least one control signal comprising a Scan Enable (SE) signal;
providing a flip flop apparatus coupled to the plurality of clock signals and the at least one control signal and comprising:
a multiplexor (MUX) comprising a data input signal, a scan in signal, and a MUX output signal;
a master latch (ML) coupled to the MUX output signal and comprising at least one ML output signal; and
a slave latch (SL) coupled to the at least one ML output signal and comprising a SL output signal;
selectively generating the MUX output signal from the data input signal and the scan in signal in response to the SE signal;
inverting the B clock signal;
generating the ML output signal from the MUX output signal by responding to the inverted B clock signal and the C clock signal when both the B clock signal is inactive and the C clock signal is active or when the A clock is active; and generating the SL output signal from the ML output signal by responding to the B clock signal when the B clock is active.

15. A method comprising the steps of:
providing a plurality of clock signals comprising an inverted C clock signal, a B clock signal, and an A clock signal;
providing at least two control signals comprising a Scan Enable (SE) signal and a Master Latch Enable (MLE) signal;
providing a flip flop apparatus coupled to the plurality of clock signals and the at least one control signal and comprising:
a multiplexor (MUX) comprising a data input signal, a scan in signal, and a MUX output signal;
a master latch (ML) coupled to the MUX output signal and comprising at least one ML output signal; and
a slave latch (SL) coupled to the at least one ML output signal and comprising a SL output signal;
selectively generating the MUX output signal from the data input signal and the scan in signal in response to the SE signal;
inverting the inverted C clock signal to create a first C clock signal; generating the ML output signal from the MUX output signal by responding to the MLE signal, inverted C clock signal, and A clock signal; and
generating the SL output signal from the ML output signal by responding to the inverted C clock signal and the B clock signal.

16. The method of claim 15 wherein the step of generating the ML signal from the MUX output signal by responding to the MLE signal, inverted C clock signal, and A clock signal comprises the step of generating the ML output signal from the MUX output signal when both the inverted C clock and the MLE clock signals are active or when the A clock is active, and wherein the step of generating the SL output signal from the ML output signal by responding to the inverted C clock signal and the B clock signal comprises the step of generating the SL output signal from the ML output signal when both the B clock is active and the inverted C clock is inactive.

17. The method of claim 15 wherein the at least one control signal further comprises an enable signal, wherein the plurality of clock signals further comprises a second C clock signal and an edge clock signal, and wherein method further comprises the step of generating the inverted C clock signal by responding to the second C clock signal, enable signal, and edge clock signal.

18. A flip flop (FF) apparatus comprising:
a single clock splitter (CS) comprising:
a first delay element having a first delay;
a CS multiplexor (MUX) having first and second CS data inputs, a CS selection input, and a CS MUX output, the CS MUX responsive to the CS selection input to selectively generate the CS MUX output from the first and second CS data inputs, wherein a second delay from the first data CS input to the CS MUX output is less than the first delay;
a clock input coupled to an input of the first delay element and coupled to the first CS data input of the CS MUX;
a Master Latch (ML) clock output coupled to an output of the first delay element; and
a Slave Latch (SL) clock output coupled to the CS MUX output;
a FF multiplexor (MUX) comprising a Scan Enable (SE) signal, a FF data input signal, a scan in signal, and a FF MUX output signal, the MUX responsive to the SE signal to selectively generate the FF MUX output signal from the FF data input signal and the scan in signal;

a ML coupled to the MUX output signal and the ML clock output and comprising a ML output signal, the ML responsive to the ML clock output to generate the ML output signal from the FF MUX output signal; and a SL coupled to the at least one ML output signal and the SL clock output and comprising a SL output signal, the SL responsive to the SL clock output to generate the SL output signal from the ML output signal.

19. The flip flop apparatus of claim 18, further comprising:

an inverter having an input and an output, the input coupled to the SE signal;

a first OR gate, one input of the first OR gate coupled to the SL output and another input of the first OR gate coupled to the output of the inverter; and a second OR gate, one input of the second OR gate coupled to the SL output and a second input of the second OR gate coupled to the SE signal;

wherein the FF MUX is responsive to the SE signal to selectively generate the FF MUX output signal from the FF data input signal, when the SE signal is a logical low, and the scan in signal, when the SE signal is a logical high.

20. The flip flop apparatus of claim 18, further comprising:

an inverter having an input and an output, the input coupled to the SE signal;

a first AND gate, one input of the first AND gate coupled to the SL output and another input of the first AND gate coupled to the output of the inverter; and a second AND gate, one input of the second AND gate coupled to the SL output and a second input of the second AND gate coupled to the SE signal;

wherein the FF MUX is responsive to the SE signal to selectively generate the FF MUX output signal from the FF data input signal, when the SE signal is a logical high, and the scan in signal, when the SE signal is a logical low.

21. A flip flop (FF) apparatus comprising:

a single clock splitter (CS) comprising:

a first delay element having a first delay and comprising a first inverter;

a CS multiplexor (MUX) having first and second CS data inputs, a CS selection input, and a CS MUX output, the CS MUX responsive to the CS selection input to selectively generate the CS MUX output from the first and second CS data inputs, wherein a second delay from the first data CS input to the CS MUX output is less than the first delay;

a clock input coupled to an input of the first delay element and coupled to the first CS data input of the CS MUX;

a second inverter coupled between the clock input and the second CS data input, wherein the CS MUX comprises a first driver and a second driver, the first driver coupled between the first CS data input and the CS MUX output, and the second driver coupled between the second CS data input and CS MUX output;

a Master Latch (ML) clock output coupled to an output of the first delay element; and a Slave Latch (SL) clock output coupled to the CS MUX output.

22. The flip flop apparatus of claim 21 wherein each of the first and second drivers comprise a P-channel transistor and an N-channel transistor, wherein the single clock splitter further comprises a third inverter coupled between the control input and transistor control inputs for the P-channel transistor in the second driver and the N-channel transistor in the first driver, and wherein the control input is coupled to transistor control inputs for the N-channel transistor in the second driver and the P-channel transistor in the third driver.

* * * * *